(12) United States Patent
Tsapatsis et al.

(10) Patent No.: US 7,357,836 B2
(45) Date of Patent: Apr. 15, 2008

(54) CRYSTALLINE MEMBRANES

(75) Inventors: Michael Tsapatsis, Minneapolis, MN (US); Zhiping Lai, Amherst, MA (US)

(73) Assignee: University of Massachusetts, Boston, MA (US)

( * ) Notice: Subject to any disclaimer, the term of this patent is extended or adjusted under 35 U.S.C. 154(b) by 285 days.

(21) Appl. No.: 10/794,483

(22) Filed: Mar. 5, 2004

(65) Prior Publication Data

US 2005/0014371 A1  Jan. 20, 2005

Related U.S. Application Data

(60) Provisional application No. 60/452,375, filed on Mar. 6, 2003.

(51) Int. Cl.
   *C30B 7/08* (2006.01)
(52) U.S. Cl. .............................. 117/68; 117/69; 117/70; 585/407; 585/734; 585/739
(58) Field of Classification Search .................. 117/68, 117/69, 70; 585/407, 734, 739
   See application file for complete search history.

(56) References Cited

U.S. PATENT DOCUMENTS

| 3,936,276 A | 2/1976 | Balitsky et al. |
| 4,021,294 A | 5/1977 | Khadzhi et al. |
| 4,585,638 A | 4/1986 | Kuhl |
| 6,258,991 B1 * | 7/2001 | Verduijn et al. ............. 585/407 |
| 6,319,730 B1 * | 11/2001 | Ramdani et al. ............... 438/3 |
| 2003/0104925 A1 * | 6/2003 | Lai et al. ........................ 502/4 |

FOREIGN PATENT DOCUMENTS

JP  11-199384 A  7/1999

OTHER PUBLICATIONS

Beck and Davis, "Alkylammonium polycations as structure-directing agents in MFI zeolite synthesis," Microporous Mesoporous Mater. 22:107-14 (1998).
Bein, "Synthesis and Applications of Molecular Sieve Layers and Membranes," Chem. Mater. 8:1636-53 (1996).
Boudreau and Tsapatsis, "A Highly Oriented Thin Film of Zeolite A," Chem. Mater. 9:1705-09 (1997).
Burkett and Davis, "Mechanism of Structure Direction in the Synthesis of Si-ZSM-5: An Investigation by Intermolecular $^1$H-$^{29}$Si CP MAS NMR," J. Phys. Chem. 98:4647-53 (1994).
Caro et al., "Zeolite membranes—state of their development and perspective," Microporous Mesoporous Mater. 38:3-24 (2000).

(Continued)

*Primary Examiner*—Robert Kunemund
(74) *Attorney, Agent, or Firm*—Fish & Richardson P.C.

(57) ABSTRACT

In certain aspects, the invention features methods for forming crystalline membranes (e.g., a membrane of a framework material, such as a zeolite) by inducing secondary growth in a layer of oriented seed crystals. The rate of growth of the seed crystals in the plane of the substrate is controlled to be comparable to the rate of growth out of the plane. As a result, a crystalline membrane can form a substantially continuous layer including grains of uniform crystallographic orientation that extend through the depth of the layer.

31 Claims, 12 Drawing Sheets

OTHER PUBLICATIONS

Davis and Lobo in "Zeolite and molecular-sieve synthesis," Chem. Mat. 4(4):756-768 (1992).

Davis, "Ordered porous materials for emerging applications," Nature 417:813-21 (2002).

de Vos and Verweij, "High-Selectivity, High-Flux Silica Membranes for Gas Separation," Science 279:1710-11 (1998).

de Vos Burchart et al., "Molecular mechanics studies on MFI-type zeolites," Zeolites 13:216-221 (1993).

Dong et al., "Template-removal-associated microstructural development of porous-ceramic-supported MFI zeolite membranes," Microporous Mesoporous Mater. 34:241-53 (2000).

Flanigen et al., "Silicate, a new hydrophobic crystalline silica molecular sieve," Nature 271:512-16 (1978).

Gouzinis and Tsapatsis, "On the Preferred Orientation and Microstructural Manipulation of Molecular Sieve Films Prepared by Secondary Growth," Chem. Mater. 10:2497-2504 (1998).

Gump et al., "Aromatic Permeation through Crystalline Molecular Sieve," Ind. Eng. Chem. Res. 40:565-77 (2001).

Ha et al., "Micropatterning of Oriented Zeolite Monolayers on Glass by Covalent Linkage," Adv. Mater. 12:1614-17 (2000).

Hedland et al., "High-flux MFI membranes," Microporous Mesoporous Mater. 52:179-89 (2002).

Hedlund et al., "Controlling the preferred orientation in silicalite-1 films synthesized by seeding," Microporous Mesoporous Mater. 28:185-94 (1999).

Keizer et al., "Two component permeation through thin zeolite MFI membranes," J. Membr. Sci., 147:159-72 (1998).

Kondo et al., "Tubular-type pervaporation module with zeolite NaA membrane," J. Membr. Sci. 133:133-41 (1997).

Koros and Mahajan, "Pushing the limits on possibilities for large scale gas separation: which strategies?," J. Membr. Sci. 181:141 (2001) Abstract.

Lobo et al., "Structure-direction in zeolite synthesis," Journal of Inclusion Phenomena and Molecular Recognition in Chemistry 21(1-4):47-78 (1995).

Lok et al., "The role of organic molecules in molecular sieve synthesis," Zeolites 3:282-91 (1983).

Lovallo and Tsapatsis, "Preferentially Oriented Submicron Silicalite Membranes," AichE J. 42:3020-29 (1996).

Lovallo et al., "Synthesis and Characterization of Oriented MFI Membranes Prepared by Secondary Growth," AICHE J., 44:1903-13 (1998).

Lu et al., "Continuous formation of supported cubic and hexagonal mesoporous films by sol-gel dip-coating," Nature 389:364-68 (1997).

Merkel et al., "Ultrapermeable, Reverse-Selective Nanocomposite Membranes," Science 296:519-522 (2002).

Mintova et al., "Growth of silicalite-1 films on gold substrates," Microporous Mater. 11:(3-4):149-160 (1997).

Ozin et al., "Advanced Zeolite Materials Science," Angew. Chem. Int. Ed. Engl. 28:359-76 (1989).

Rolison, "Zeolite-Modified Electrodes and Electrode-Modified Zeolites," Chem. Rev. 90:867-878 (1990).

Schoeman et al., "Synthesis and Size Tailoring of Colloidal Zeolite Particles," J. Chem. Soc. Chem. Comm. 994-995 (1993).

Shiflett and Foley, "Ultrasonic Deposition of High-Selectivity Nanoporous Carbon Membranes," Science 285:1902-05 (1999).

Song et al., "Experimental and molecular simulation studies of adsorption and diffusion of cyclic hydrocarbons in silicalite-1," Microporous Mesoporous Mater. 55:31-49 (2002).

Tasapatsis et al., "Zeolite Membranes," CATTECH 3:148-63 (2000).

Tsapatsis et al., "Growth, microstructure, and permeation properties of supported zeolite (MFI) films and membranes prepared by secondary growth," Chem. Eng. Sci. 54:3521-31 (1999).

Wang and Yan, "Controlling Crystal Orientation in Zeolite MFI Think Films by Direct In Situ Crystallization," Chem. Mater. 13:1101-07 (2001).

Wang et al., "Pure-Silica Zeolite Low-$k$ Dielectric Thin Films," Adv. Mater. 13:746-749 (2001).

Xomeritakis et al., "Separation of Zylene Isomer Vapors with Oriented MFI Membranes Made by Seeded Growth," Ind. Eng. Chem. Res. 40:544-552 (2001).

International Search Report mailed Aug. 11, 2005 (Appl. No. PCT/US04/06950).

* cited by examiner

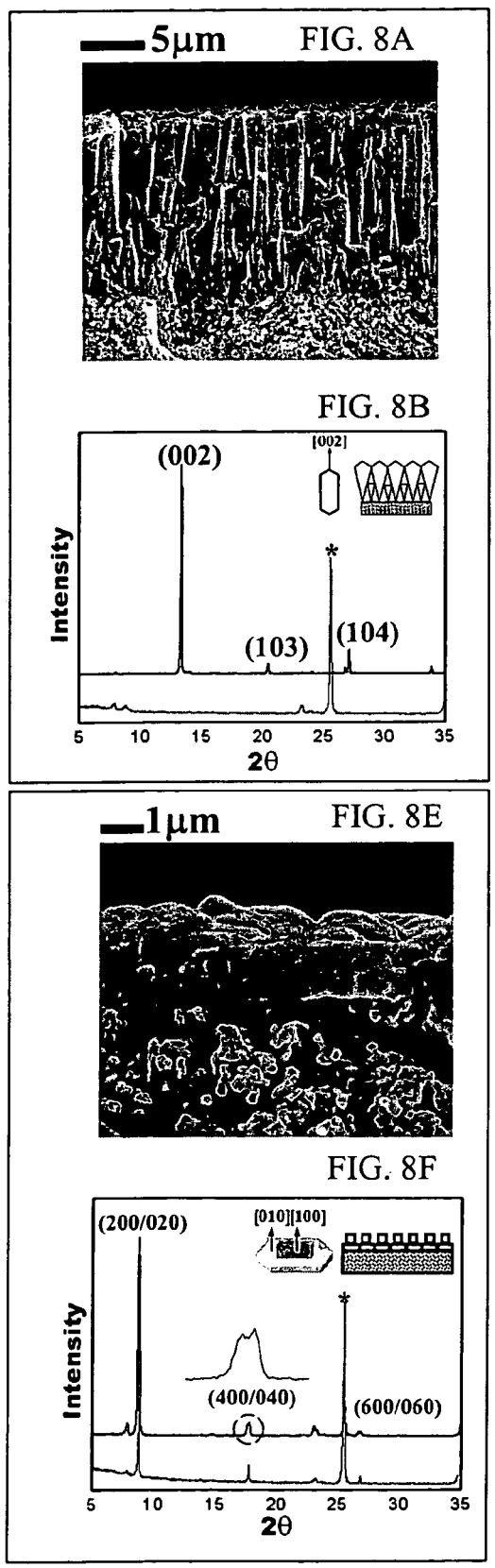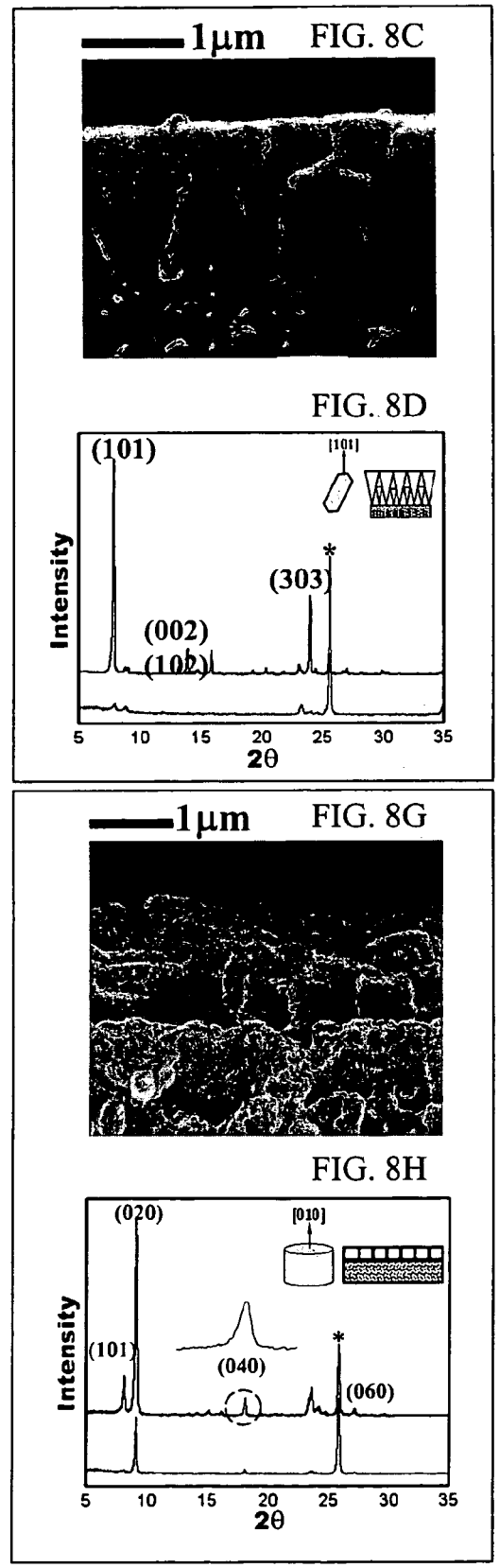

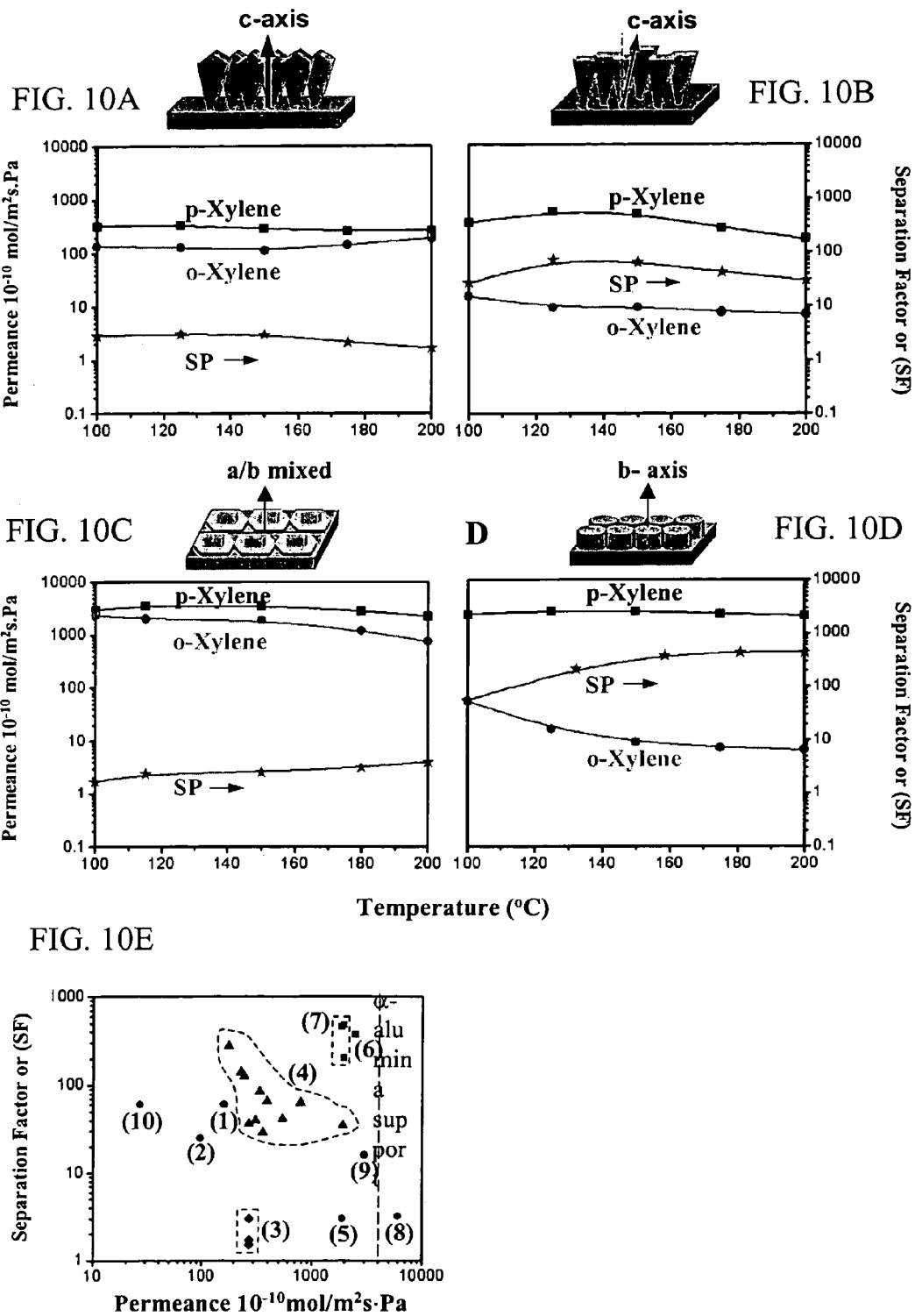

CRYSTALLINE MEMBRANES

CROSS-REFERENCE TO RELATED APPLICATIONS

This application claims priority from Provisional Patent Application No. 60/452,375, entitled "CRYSTALLINE MEMBRANES," filed on Mar. 6, 2003, the entire contents of which is hereby incorporated by reference.

STATEMENT AS TO FEDERALLY SPONSORED RESEARCH

This invention was made with Government support under grant numbers CTS-0091406 and CTS-0103010 awarded by the National Science Foundation, and grant number NAG8-1697 awarded by NASA. The Government has certain rights in the invention.

TECHNICAL FIELD

The invention relates to crystalline membranes, methods for making crystalline membranes, and applications of crystalline membranes.

BACKGROUND

Inorganic crystalline membranes are of interest in many industries as functional layers in, for example, porous or protective films. Zeolites are a class of inorganic crystalline materials with desirable characteristics for such membranes. Zeolites are crystalline aluminosilicates, containing molecular sized pores. For example, ZSM-5 zeolites have an MFI framework with intersecting pores having a diameter of 5 to 6 Angstroms. Zeolites are an important material for catalyzing reactions, and are commonly used in the catalytic cracking of petroleum and other reactions of hydrocarbons. They are commonly provided in a powder form and are used to selectively crack straight chain molecules over branched chain molecules. Furthermore, zeolite particles have been used to selectively form para-xylene, which is used to make terephthalic acid for various polymerization reactions and in the synthesis or rearrangement of xylenes.

Zeolites are formed with a three-dimensional structure in which tetrahedra of primarily $SiO_4$ and $AlO_4$ are crosslinked by sharing oxygen atoms, whereby the ratio of Si to O atoms is 1:2. Depending on the manner of bonding, the crystal structures can have various ring sizes containing 8, 10, 12, or 14 metal/semi-metal atoms. These rings define pores and chambers that are of molecular size. The presence of these chambers promotes the separation of molecules according to their size and their affinity to the zeolitic surface. Because zeolites are commonly available in the form of fine powders, catalytic systems including zeolites frequently use packed or fluidized beds made of zeolite crystal powders or small pellets made up of multiple zeolite crystals.

SUMMARY

In general, the invention features methods for forming crystalline membranes (e.g., a membrane of a framework material, such as a zeolite) by inducing secondary growth in a layer of oriented seed crystals. The rate of growth of the seed crystals in the plane of the substrate is controlled to be comparable to the rate of growth out of the plane. As a result, a crystalline membrane can form a substantially continuous layer including grains of uniform crystallographic orientation that extend through the depth of the layer.

In one aspect, the invention features methods of forming a film that includes obtaining a layer of oriented seed crystals and growing the oriented seed crystals to form a film defining a surface, wherein the seed crystals' growth rate parallel to the surface is substantially the same as their growth rate normal to the surface.

Embodiments of the methods can include one or more of the following features and/or features of other aspects. For example, growing the seed crystals can include exposing the oriented seed crystal layer to a solution (e.g., an aqueous solution). The solution can include a first structure directing agent, and/or a mineralizing agent (e.g., potassium hydroxide or sodium hydroxide). During growth, the solution can be heated to between about 50° C. and 200° C. The method can also include forming the seed crystals using a seed structure directing agent, which can be the same or different than the first structure directing agent. Either structure directing agent can include an organic cation (e.g., tetrapropylammonium hydroxide (TPA)). They can be an oligomer (e.g., a dimer or trimer). In some embodiments, the first and/or seed structure directing agent is trimer TPA.

The layer of oriented seed crystals can be obtained by disposing seed crystals on a surface of a substrate. The seed crystals can include a framework material (e.g,. a zeolite such as silicalite-1). The framework material can have an MFI structure. The methods can include applying a coupling agent (e.g., a silane) to the surface of the substrate before disposing the seed crystals wherein the coupling agent bonds (e.g., covalently bonds) to the substrate surface and to the seed crystals.

The seed crystals can be disc-shaped (e.g., shaped as oval or round discs). Alternatively, the seed crystals can be box-like, coffin-shaped, or plate-like. Each seed crystal has a first crystallographic axis (e.g., a-, b-, or c-axis) and the first crystallographic axis of a majority (e.g., more than 50 percent of the seed crystals, such as more than 75, 85, 95 percent) of the seed crystals can be substantially parallel to each other. The first crystallographic axis of the seed crystals can be substantially normal or parallel to a plane of the substrate surface (e.g., at least 50 percent of the seed crystals crystallographic axes can be within 10 degrees of normal, such as within five degrees of normal). The oriented seed crystal layer can be a monolayer (i.e., the layer can be substantially only one seed crystal thick, e.g., about 10 percent or less of the seed crystals can overlap with other seed crystals).

During growth of the oriented seed crystal layer, the seed crystals growth rate parallel to the surface can be between about 0.5 and two times the growth rate normal to the surface.

In some embodiments, during growth of the layer, substantially no crystal nucleation occurs in the solution or on a surface of the seed crystals.

In general, in another aspect, the invention features methods of forming a film including disposing anisotropic seed crystals on a surface of a substrate, wherein each seed crystal has a short axis, and exposing the seed crystals to a solution to grow the seed crystals, wherein the growth rate of each seed crystal along its short axis is substantially the same as the growth rate along another axis.

Embodiments of the methods can include one or more of the following features and/or features of other aspects. For example, the seed crystals can form an oriented seed crystal layer on the substrate surface. For a majority (i.e., more than about 50 percent of the seed crystals, such as more than about 75, 85, 95 percent) of the seed crystals in the oriented seed crystal layer, the short axis can be oriented substantially orthogonal to the substrate surface. The seed crystals can include a framework material (e.g., a zeolite). In embodiments where the framework material is a zeolite, it can include channels running substantially parallel to the short axis.

The solution can include a structure directing agent. The seed crystals can be exposed to the solution for sufficiently long to form a substantially continuous layer of the seed crystal material (e.g., discontinuities can form about 5%, 3%, 2%, 1% or less of the layer).

In general, in a further aspect, the invention features articles including a porous substrate having a surface and a substantially continuous layer of a framework material bound to the surface, wherein the layer of framework material comprises a plurality of crystal grains that extend through the depth of the layer. In a substantially continuous layer, discontinuities can form about 5%, 3%, 2% or less of the layer.

Embodiments of the articles can include one or more of the following features and/or features of other aspects. For example, the framework material can be a zeolite (e.g., silicalite-1). The framework material can be a porous framework material. For example, the porous framework material can include channels that run through the depth of the layer. The framework material can have an MFI structure. The layer can include a plurality of crystalline grains. The crystalline grains can extend through the depth of the layer. The crystalline grains can have an oriented crystallographic axis, which can be, for example, orthogonal or parallel to the substrate surface. In some embodiments, the oriented crystallographic axis is the b-axis or a-axis of an MFI structure. An average ratio of the layer thickness to the crystalline grains' maximum size parallel to the substrate surface can be less than about two (e.g., about 1.5, 1.0, 0.5, or less). The average of the crystalline grains' maximum size parallel to the substrate surface can be at least 200 nanometers. The layer can be substantially intergrown (i.e., discontinuities in the framework material can include about 5%, 3%, 2% or less of the layer). The layer can be less than 50 microns thick, e.g., 10 microns, 5 microns, one micron thick, or less.

The porous substrate can include a metal oxide (e.g., α-alumina). The porous substrate can include mesoporous silica. The framework material can be covalently bonded to the substrate surface. For example, the article can include a coupling agent that covalently bonds the framework material to the substrate surface.

The articles can be prepared using methods described herein.

In another aspect, the invention features methods of separating a first compound from a second compound different from the first compound including filtering a mixture of the first and second compounds through the article to produce a filtrate, wherein a relative concentration of the first compound compared to the second compound in the filtrate is at least 10 times a relative concentration of the first compound compared to the second compound in the mixture. The first compound can be an isomer of the second compound. The relative concentration of the first compound compared to the second compound in the filtrate can be about 100 or more (e.g., more than 200, 300, 500, 1,000, 2,500) times the relative concentration of the first compound compared to the second compound in the mixture. The article can have a first compound permeance of about $1,000 \times 10^{-10}$ mol/m$^2$sPa or more (e.g., $2,000 \times 10^{-10}$, $5,000 \times 10^{-10}$, $10,000 \times 10^{-10}$ mol/m$^2$sPa or more).

In another aspect, the invention features a reactor including a reaction chamber and an article disposed relative to the reaction chamber, wherein during operation the reactor produces a compound which exits the reaction chamber through the article. The article can be substantially impermeable to reagents used in the reactor (e.g., can have a permeance less than about $10 \times 10^{-10}$ mol/m$^2$sPa for the reagents). The article can be substantially impermeable to reaction products other than the compound produced during operation of the reactor (e.g., can have a permeance less than about $10 \times 10^{-10}$ mol/m$^2$sPa for the reaction products).

In another aspect, the invention features a method of forming a reaction product, including providing the reactor, placing reaction reagents in the reaction chamber, reacting the reaction reagents in the reaction chamber to form the compound, and removing the compound through the article, wherein the removed compound is the reaction product.

In other aspects, the invention features molecular sieves including the article, and methods of making molecular sieves by obtaining the article and attaching the article to a fluid conduit to obtain the molecular sieve. The invention also features protective coatings including the article, and methods of making protective coatings by obtaining the article and applying the article to a surface of an object to form a protective coating for the object.

In general, in another aspect, the invention features articles including a substrate having a surface and a layer of a framework material disposed on the surface, wherein the article has a para-xylene permeance of about $1,000 \times 10^{-10}$ mol/m$^2$sPa or more (e.g., $2,000 \times 10^{-10}$, $5,000 \times 10^{-10}$, $10,000 \times 10^{-10}$ mol/m$^2$sPa or more) and a para-xylene to ortho-xylene separation factor of about 100:1 or more (e.g., 200:1, 300:1, 500:1, 800:1, 1,000:1 or more).

In a further aspect, the invention features articles including a substrate having a surface and a layer of a framework material disposed on the surface, wherein the article has a benzene permeance of about $100 \times 10^{-10}$ mol/m$^2$sPa or more (e.g., $200 \times 10^{-10}$, $500 \times 10^{-10}$, $1000 \times 10^{-10}$ mol/m$^2$sPa or more) and a benzene to cyclohexane separation factor of about 15:1 or more (e.g., 20:1, 30:1, 50:1, 100:1 or more) at temperatures of about 150° C. or more (e.g., 155, 160, 200° C., or more).

Embodiments of the articles can include one or more of the features of other aspects. The articles can be prepared using methods described herein.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DESCRIPTION OF DRAWINGS

FIG. 3C is an SEM micrograph of the characteristic shape of the MFI seed crystal. FIG. 3D is a transmission electron microscope (TEM) micrograph of the seed crystal, and FIG. 3E is another TEM micrograph of the seed crystal showing a section of the seed crystal at higher resolution.

FIG. 8A and FIG. 8B are a SEM micrograph and XRD spectra of a zeolite membrane formed with a randomly oriented seed layer and c-oriented secondary growth, respectively.

FIG. 8C and FIG. 8D are a SEM micrograph and XRD spectra of a zeolite membrane formed from formed with a randomly oriented seed layer and [h0h]-oriented secondary growth, respectively.

FIG. 8E and FIG. 8F are a SEM micrograph and XRD spectra of a zeolite membrane formed from b-oriented seed layer and obtained after secondary growth with TPA and where the secondary growth has b- and a-orientation, respectively.

FIG. 8G and FIG. 8H are a SEM micrograph and XRD spectra of a zeolite membrane formed from a b-oriented seed layer and obtained after secondary growth with trimer TPA and where the secondary growth has b- and a-orientation, respectively.

FIG. 10A-10D are graphs showing MFI membrane performance in xylene isomer separation. Para-xylene, o-xylene permeance and mixture separation factor (SP) are plotted versus temperature of permeation for typical c-oriented (FIG. 10A), [h0h]-oriented (FIG. 10B), a-and b-oriented (FIG. 10C) and b-oriented film (FIG. 10D).

FIG. 10E is a plot comparing separation factor versus permeance for various zeolite membranes.

Like reference symbols in the various drawings indicate like elements.

DETAILED DESCRIPTION

Figure 1:
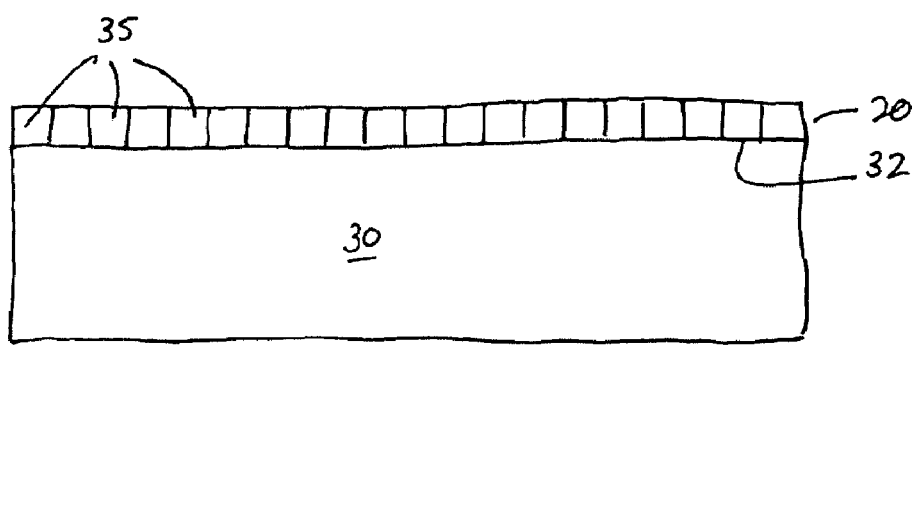
FIG. 1 is a schematic side view of a multilayer article.

Referring to FIG. 1, a multilayer article 10 includes an inorganic crystalline layer 20 disposed on a surface 32 of a substrate 30. Crystalline layer 20 is composed of a framework material. The framework material is bound to the substrate surface and forms a substantially continuous layer. Crystalline layer 20 includes multiple grains (domains), three of which are indicated by numeral 35 in FIG. 1. The grains extend through the depth of layer 20 and have uniform crystallographic orientation throughout the layer. In general, the depths of the grains are comparable to their average dimension parallel to the plane of the substrate. In other words, on average, the ratio of the grains' depth to their in-plane dimension is less than about 2-to-1 (e.g., less than 1.5-to-1, 1-to-1, 0.75-to-1, such as 0.5-to-1 or less). The in-plane grain size can vary. Generally, the average maximum in-plane grain size is at least about 200 nanometers (e.g., about 500 nanometers to one micron or more). Multilayer article 10 can extend for several millimeters, centimeters, or more in the substrate plane.

Preferably, there are no discontinuities in layer 20. Discontinuities refer to voids in the framework material layer extending through the depth of the layer and having a maximum dimension parallel to the substrate surface greater than the size of channels in the framework material. In some embodiments, discontinuities refer to voids having a maximum dimension parallel to the substrate surface greater than about one nanometer (e.g., two nanometers, three nanometers, five nanometers, 10 nanometers or more). In general, discontinuities occupy less than about five percent of crystalline layer 20 (e.g., less than about three percent, two percent, one percent, one-half percent, or less). Crystalline layers that have relatively few discontinuities are said to be well-intergrown layers.

In certain embodiments, the framework material is a b-oriented MFI zeolite (e.g., silicalite-1). "b-oriented" refers to the crystalline axis oriented normal to the plane of the substrate. MFI structure is well known and generally described, for example, by Ch Baerlocher, W. M. Meier and D. H. Olson in, "Atlas of Zeolite Structure Types," Fifth Revised Edition, Elsevier, 2001. More generally, the chemical makeup, framework structure, and orientation of the framework structure of layer 20 can vary depending on the specific application for which article 10 is to be used. Other examples of framework structures include LTA, LTL, FAU, BEA, MEL, MOR, MTW. These and other framework structures are described in the above-cited "Atlas of Zeolite Framework Types."

The framework material can be preferentially oriented with respect to the substrate surface. For example, the framework material can be a-, b- or c-oriented or it can be hoh-oriented or otherwise oriented with a certain crystallographic zone axis mostly perpendicular to the substrate.

In certain embodiments, the framework material is a zeolite, however, in general the invention is not so limited. For example, the framework material can be composed of $AlO_4$ and $PO_4$ tetrahedra. In other examples, the framework material can be composed of $SiO_4$ and $AlO_4$ tetrahedra and $TiO_6$ octahedra and/or $TiO_5$ semi-octahedra. In a further example, the framework material can be composed of $CeO_6$ octahedra and $SiO_4$ terahedra.

The thickness of layer 20 can vary depending on the end use application of the multilayer article. Typically, the thickness of layer 20 is on the order of a few microns (e.g., about two microns, three microns, or five microns). In some embodiments, layer 20 can be relatively thin, e.g., one micron or less. Alternatively, layer 20 can have a thickness of about 10 microns or more, e.g., about 50 microns or more.

In some embodiments, the framework material of layer 20 can be porous. The framework material can have channels running through the depth of layer 20 (e.g., substantially orthogonal to the plane of substrate 30). Because the crystal grains are continuous through the depth of the layer, the channels can be substantially continuous through the layer. For example, a b-oriented MFI layer has channels with an approximate free diameter of 5.5 Angstrom running through the depth of the layer. Alternatively, or additionally, the framework material can have pores running substantially parallel to the plane of surface 32. For example, for a c-oriented MFI layer the channels run substantially parallel to the plane of the substrate. Typically, channels are formed from six, eight, ten, twelve, or fourteen or eighteen-membered rings (MR), although larger channels are possible. This corresponds to a channel diameter range of approximately 3-15 Angstroms (e.g., about 5, 6, 8, 10, or 12 Angstroms). In general, the diameter of the channels depends on the type of framework structure and the chemistry of the framework material. In titanosilicate microporous framework oxides and aluminosilicate zeolites, for example, the framework is anionic and the charge is balanced by extra-framework cations that can be positioned (e.g., by ion exchange) to alter the effective pore openings. In another example, substitution (e.g., isomorphous substitution) of Si or Al at the tetrahedral sites with other elements like B or Ti can alter the pore opening. Furthermore, in certain zeolites, isomorphous substitution of Si with B leads to pore size reduction.

In some embodiments, the substrate can be formed from an inorganic material, such as a metal, an alloy, a ceramic, or a metal oxide. Examples of metal substrate materials include aluminum or stainless steel. Examples of alloy substrate materials include Pd/Ag alloys.

Examples of ceramics include SiC. Examples of metal oxide substrate materials include alumina, zirconia, silica. In some embodiments, the substrate material can be a semiconductor material, such as silicon.

Alternatively, or additionally, the substrate can include an organic material, such as a polymer. Examples of polymers that can be used as substrate materials include polyethylene, poly methylmethacrylate, polyimide, polybenzimidazole, and teflon.

In some embodiments, the substrate is formed from a composite material (e.g., having both organic and inorganic components). One type of composite material includes a continuous phase polymer surrounding a dispersed phase inorganic material, such as a polymer/exfoliated clay, polymer/exfoliated or delaminated layered aluminosphosphate or layered silicate nanocomposite. Another type of composite includes a polymer substrate with a continuous or patterned metal, oxide, or alloy overlayer.

Substrate 30 can be formed from a porous material. For example, the substrate can include pores that run through its depth (e.g., orthogonal to the plane of the substrate). Examples of porous substrate materials include alumina, stainless steel, silicon carbide, anodized alumina, porous polymers, silica, titania, zirconia. The size of the pores can vary depending on the specific end use application. In some embodiments, the pores can be small, e.g., have diameters on the scale of nanometers, such as less than about five nanometers. In other embodiments, the pores may be relatively large, such as tens, hundreds, or even thousands of nanometers wide (e.g., more than about 10 nanometers, 50 nanometers, 100 nanometers, 200 nanometers, 500 nanometers, or 5000 nanometers).

Substrate 30 can include additional layers or coatings. These layers or coatings can be used to provide a smoother surface on which to form the framework material layer. For example, a coating of mesoporous silica can provide a smooth surface on an alpha-alumina substrate. In embodiments where the substrate material has fairly large pores (e.g., several hundred nanometers in diameter) at the surface, a layer of a material with smaller pores can be used to prevent the framework material forming within the substrate material pores. Alternatively, or additionally, materials can be deposited on the substrate surface to promote the adhesion of the framework material to the substrate. For example, the substrate surface can be functionalized using a coupling agent, which covalently bonds to the substrate surface and to the framework material. Examples of coupling agents that can be used to bond zeolite framework materials to a silica substrate surface are silane coupling agents, such as 3-chloropropyltrimethoxysilane (3CP-TMS). 3CP-TMS has two functional groups, one of which reacts with the support surface and the other reacts with crystals of the framework material deposited on the substrate surface. Other examples of coupling agents include diisocyanates, DNA, cationic and anionic polymers, polyamines, and halopropylsilyl agents.

General Two-Step Method

Layer 20 is formed in a two-step method. First, an oriented layer of seed crystals are deposited on the surface of the substrate. The seed crystals are usually anisotropic in shape. The seed crystal layer is oriented because at least one crystalline axis of the seed crystals is substantially aligned. For example, disc-shaped seed crystals can preferentially lie flat against the substrate surface. Once the seed crystals are deposited on the surface, the crystalline layer is formed by inducing secondary growth in the seed crystal layer. During the secondary growth, the rate at which the seed crystals grow in the substrate plane is controlled to be comparable to the out-of-plane growth rate. Accordingly, the ratio of the out-of-plane to in-plane growth rates is within a range where surface and bulk nucleation close to the seed layer is suppressed, but secondary growth is not columnar and the resulting layer is well-intergrown.

Figure 2A:
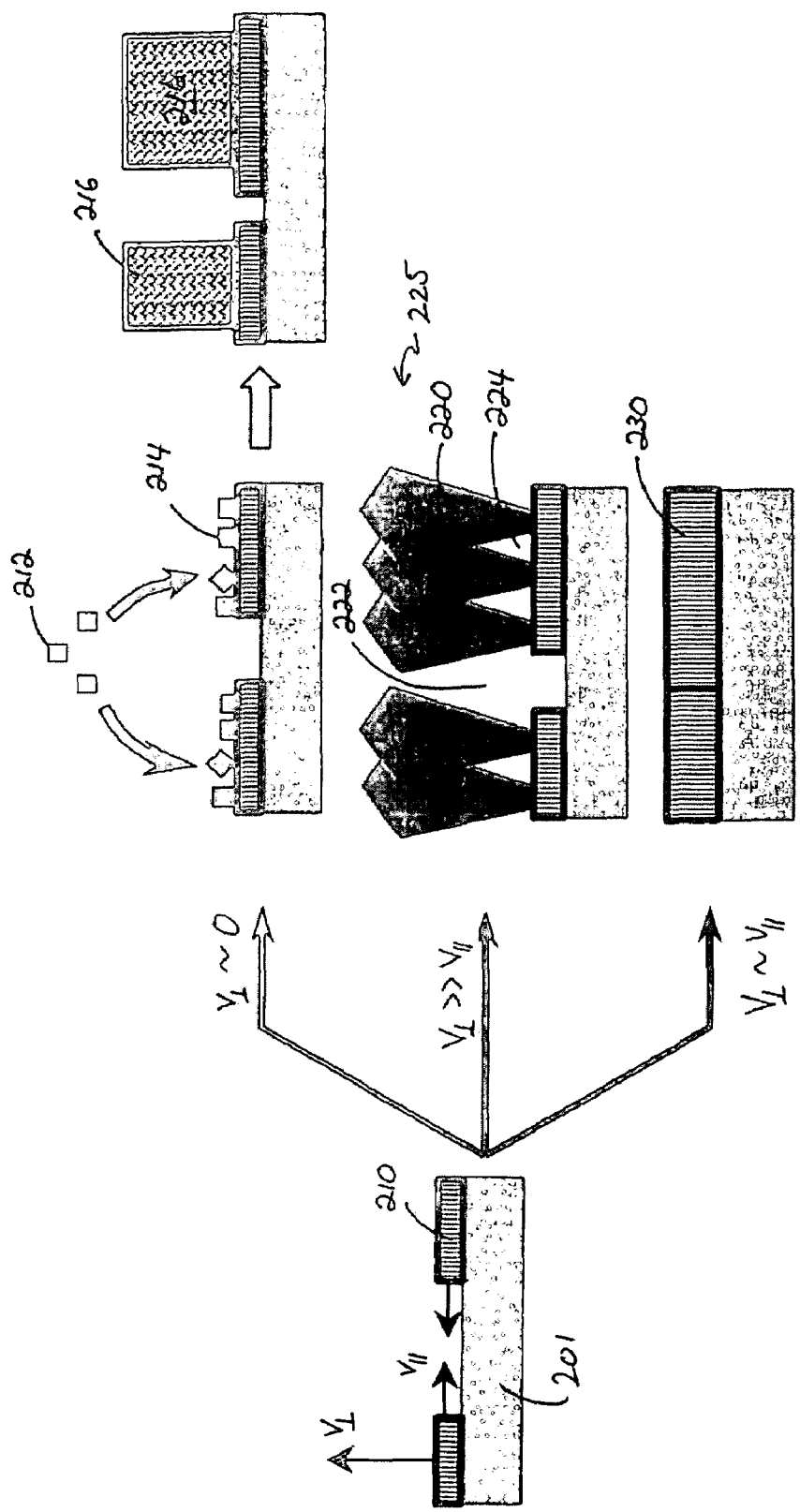
FIG. 2A is a schematic diagram illustrating three different growth regimes for an oriented seed layer.

FIG. 2A illustrates the effect of the growth rate ratios on the final structure of the framework material layer. The out-of-plane growth rate is denoted by $v_o$, while the in-plane growth rate is denoted $v_\pi$. Where the seed crystals grow at different rates in different in-plane directions, the in-plane growth rate refers to the maximum in-plane growth rate.

Figure 2B:
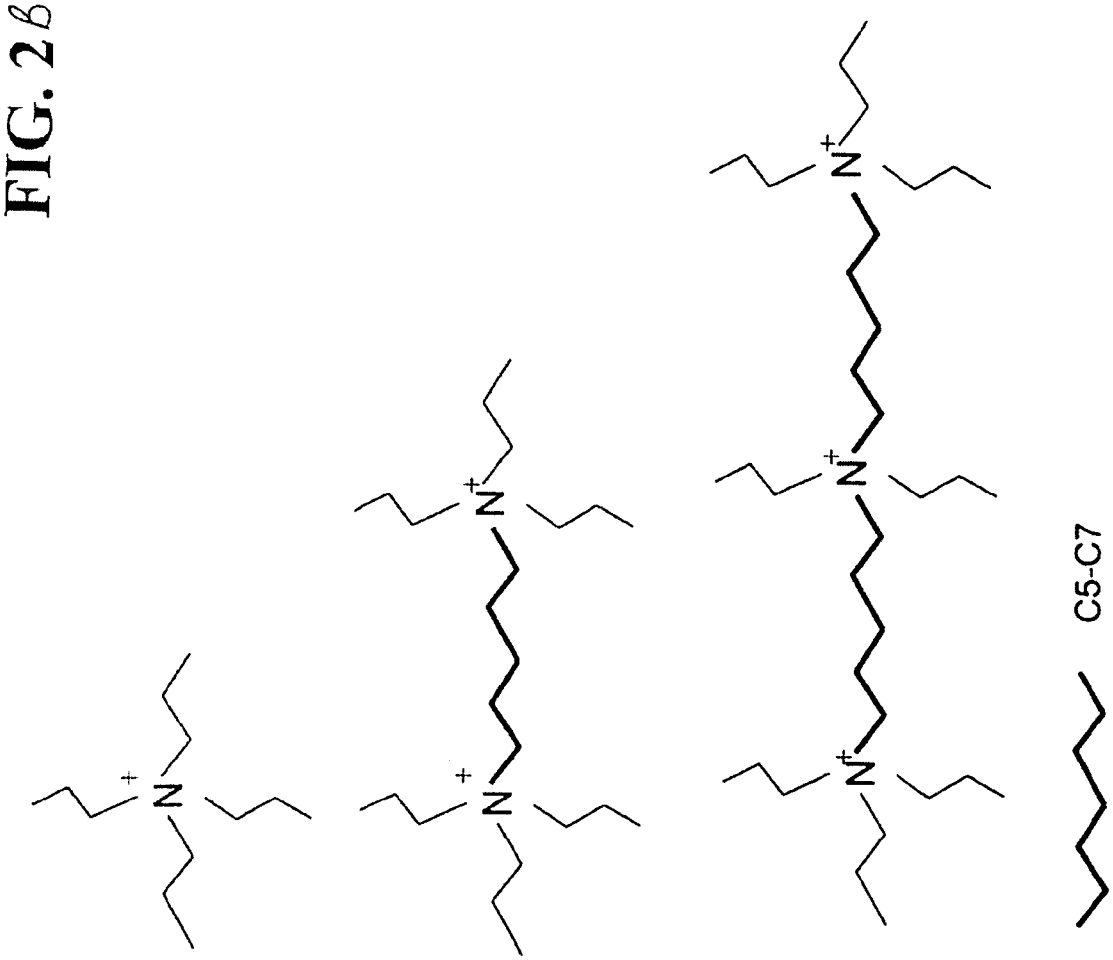
FIG. 2B is a schematic diagram showing examples of varying the structure directing agent (SDA) architecture by using dimers and trimers of the original SDA and by varying the distance between the cationic charge sites.

Referring to FIG. 2B, seed crystals 210 are deposited on the surface of substrate 201 and exposed to a solution of reactants under conditions at which the seed crystals can grow. If the out-of-plane growth rate is too slow (e.g., $v_o \ll v_\pi$, such as $v_o \approx 0$), then crystals 212 can nucleate in the solution near the seed crystals, and/or crystals 214 can nucleate on the exposed surface of the seed crystals. These nucleation events are typically undesirable for forming grains that are uniform through the depth of the crystalline layer, because nucleation in the solution can lead to particles in solution that are transported by diffusion to the exposed surfaces of the seed crystals. These particles and/or nuclei can attach to the growing crystal surfaces in undesirable orientations including random orientations. In addition, surface nucleation can lead to twinning or other unwanted growth events that also disrupt oriented growth of the seed layer.

Thus, due to undesirable nucleation, the result of growth when the out-of-plane growth rate is very small is typically a film where the grains 216 do not generally extend through the depth of the crystalline layer. In other words, the crystallographic orientation of the framework material varies through the depth of the layer.

On the other hand, if the out-of-plane growth is much faster than the in-plane growth (e.g., $v_o \gg v_\pi$), the result is usually a columnar film 225. A columnar film includes column-like grains 220, which are usually narrower in diameter closer to the seed crystals and expand as they grow away from the seed crystals. Because growth out-of-plane is so much more rapid than in-plane growth, columnar films can include discontinuities 222 and and/or enclosed voids 224.

Where the in-plane growth rate is comparable to the out-of-plane growth rate (e.g., $v_o \sim v_\pi$), resulting layer 230 includes grains that have uniform crystallographic orientation through their depth, and have minimal discontinuities or enclosed voids (e.g., no discontinuities or enclosed voids).

Although the exact ratio of out-of-plane to in-plane growth rates will vary as a function of the seed crystal chemistry, framework structure, orientation and the growth conditions (e.g., reagent chemistry and temperature), framework layers with desirable properties can be usually obtained where $v_o/v_\pi$ is between about 2 and 0.5 (e.g., about 2, 1.5, 1, 0.8, 0.6, 0.5).

Seed crystals are formed in the presence of a structure directing agent (SDA), which, in essence, acts as a template for the particular crystalline structure to be formed. The charge distribution, size, and the geometric shape of an SDA can provide its structure directing properties. Thus, the ratio of seed crystal growth rates along different crystalline axes can be manipulated by varying the composition of the SDA. For example, the number of repeating units in an oligomeric SDA as well as the distance between the structure directing moieties can affect the relative growth rates of the resulting seed crystals. Variations in the chemistry of an SDA can also affect the seed crystal growth rate ratio.

One example of controlling the ratios of growth rates using specific SDAs is to use tetrapropylammonium hydroxide (TPA) based SDAs to form silicalite-1 seed crystals. One can vary the number of TPA units as well as the distance between the nitrogen atoms as shown in FIG. 2B. The distance between units can be varied by attaching the units to each other using different size spacers (e.g., alkyl chains of differing length).

Figure 3A:
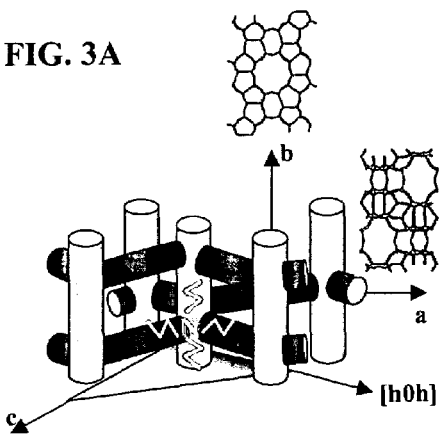
FIG. 3A is a schematic representation of a crystal having an MFI structure incorporating an SDA.
Figure 3B:
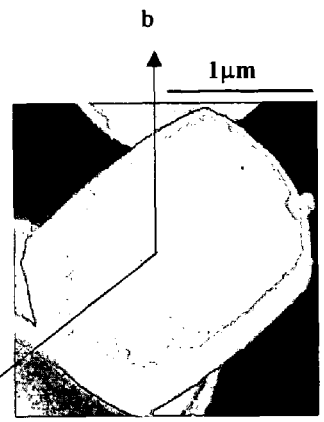
FIG. 3B is a scanning electron microscope (SEM) micrograph of the characteristic shape of an MFI seed crystal synthesized in the presence of TPA.
Figure 3C:
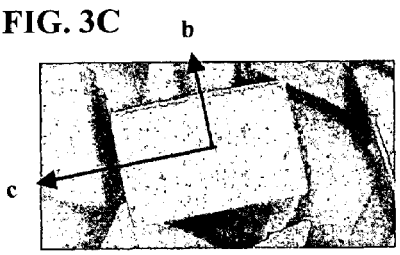
FIG. 3C-3E are a series of micrographs showing an MFI seed crystal synthesized in the presence of trimer tetrapropylammonium (TPA) hydroxide.
Figures 3D, 3E:
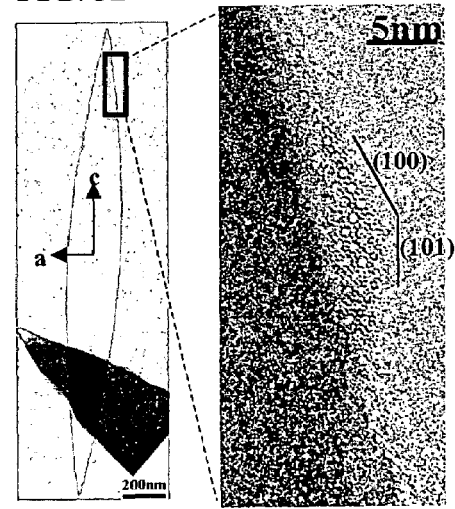
Figure 3F:
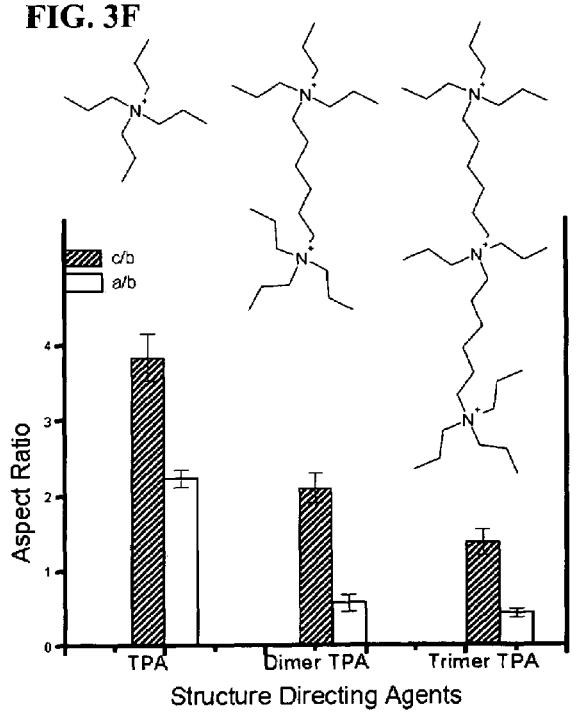
FIG. 3F is a bar graph showing the effect of different SDAs on the crystal shape by comparing the aspect ratios of the crystals (height/depth ($L_c/L_b$) and width/depth ($L_a/L_b$)) synthesized in the presence of TPA, dimer TPA, and trimer TPA, respectively. The error bars were calculated from measurements of 25 crystals.

Referring to FIGS. 3A-3F, silicalite-1 crystals synthesized using the dimer or trimer TPA with a C6 carbon chain between the N atoms have a different morphology than those obtained using TPA. The formal name for trimer TPA is Bis-N,N-(tripropylammoniumhexamethylene)-di-N,N-propylammonium trihydroxide, and the formal name for dimer TPA is Bis-1,6-(tripropylammonium)hexamethylene dihydroxide. FIG. 3A illustrates the role of TPA in forming an MFI structure. When monomer TPA is used as the SDA, the resulting seed crystal has a coffin-like shape (see FIG. 3B). Instead of the characteristic coffin shape, well-developed oval shaped crystals are observed for the trimer TPA (FIG. 3C-3E). FIG. 3D shows a comparison of the aspect ratios of the crystals synthesized using TPA, dimer and trimer TPA as the SDA under otherwise substantially identical synthesis conditions. Replacement of TPA with the dimer and trimer TPA decreases the $L_c/L_b$ ratio from about 3.8 to 2.1 to 1.4, respectively. Here, $L_x$ refers to the crystal size along the x-axis. Simultaneously, the $L_d/L_b$ aspect ratio decreases from 2.4 to 0.5 (i.e., the shortest dimension of the crystal is along the a-axis). Thus, trimer TPA significantly enhances the growth rate along the b-axis relative to that along the other axes, establishing a $L_b/L_a$ ratio greater than 1 and a $L_c/L_b$ ratio approaching 1.0.

Without wishing to be bound by theory, the $L_c/L_a$ ratio increase may be attributed to a better fit of the trimer in the straight versus the sinusoidal channel for the dimer TPA. In this particular example, examination of the (010) faces of TPA-, dimer-TPA- and trimer-TPA-grown silicalite-1 crystals by Atomic Force Microscopy (AFM) reveals an increased roughness and density of steps for the latter, suggesting increased 2-D nucleation on this face with increasing SDA length. That can be attributed to trimer-TPA depositing on (010) with its long axis perpendicular to this face. This arrangement is consistent with a better fit in the straight channels and similar to the one proposed for the dimer-TPA by E. de Vos Burchart and co-workers in Zeolites, 13:216 (1993). Variation of the carbon chain length that connects the N atoms in the TPA oligomers can further alter the fit in the various crystal directions. Accordingly, variation of carbon chain length may affect ratios of crystal growth rates along these directions by favoring one growth direction versus the other. Examples of variations of dimer TPAs include molecules that have a C5 carbon chain between the N atoms (formal name: Bis1,5(tripropylammonium) pentamethylene dihydroxide) and one that has a C7 carbon chain between the N atoms (formal name: Bis-1,7-(tripropylammonium) heptamethylene dihydroxide).

Although the effect of manipulating the relative growth rate of seed crystals using oligomeric SDAs is illustrated for a zeolite MFI crystal using TPA-based SDA's, the concept of manipulating the relative growth rate of framework structure seed crystals using oligomeric SDAs can be applied to other structures. For example, numerous high silica zeolites with structure types, such as BEA, ITE, CFI, and DON, can be formed using organic cation SDAs. It is believed that the charge to carbon atom ratio is a characteristic that can determine the structure directing ability of the cation. Thus, growth rate ratios for zeolites having the aforementioned structures can be manipulated by varying the charge to carbon atom ratio of the SDA. Furthermore, the size and shape of the cation can affect the dimensionality and size of the pore structure. Therefore, linking the original SDA in an oligomeric repeat motif retains the basic SDA characteristics, but can achieve two important outcomes: it can affect relative growth rates and thus modifying crystal shape and in-plane versus out-of-plane growth of seed layers; and/or it can reduce nucleation rates during synthesis. Both of these outcomes can allow formation of desirable microstructures.

Examples of organic structure directing agents that lead to various zeolite structures is provided by M. E. Davis and R. F. Lobo in "Zeolite and molecular-sieve synthesis," *Chem. Mat.*, 4(4):756-768 (1992) and Lobo and co-workers in "Structure-direction in zeolite synthesis," *Journal of Inclusion Phenomena and Molecular Recognition in Chemistry*, 21 (1-4):47-78 (1995).

Forming Seed Crystal Layers

Seed crystals can be formed using methods known in the art. For example, zeolite seed crystals can be formed by hydrothermal growth in a solution containing a structure directing agent, a base, an aluminum source, a silicon source, and a solvent. One example of a zeolite seed crystal formation method is disclosed by B. J. Schoeman and co-workers in *J. Chem. Soc. Chem. Comm.*, 994 (1993). In this method, the crystals are of colloidal size (e.g., about one micron in diameter) and nearly spherical in shape. In another example, seed crystals are synthesized so that they have a well-developed coffin shape (See, e.g., S. Mintova et al., *Microporous Mater.*, 11 (3-4): 149, 1997).

The composition, size, and shape of the seed crystals can vary depending on the desired composition of the framework layer to be formed. Typically, seed crystals are anisotropic in shape. For example, the seed crystals can be disc-like, ellipsoidal, leaf-like, plate-like, rectangular, or coffin-like. As discussed previously, seed crystals are typically formed in the presence of SDAs, which influence the seed crystal shape. For example, TPA yields a coffin-shaped MFI structure with the shortest dimension of the crystal along the b-axis, while dimer TPA with a C5 carbon chain between the N atoms yields cylindrical crystals with the largest dimension of the crystal along the b-axis, dimer TPA with C6 carbon chain between the N atoms yields leaf shaped crystals with the shortest dimension of the crystal along the a-axis and trimer-TPA yields an elongated leaf-shaped or plate-like MFI structure with the shortest dimension of the crystal along the a-axis. In another example, hexamethyleneimine as SDA yields plate-like layered silicate MCM-22(P) a precursor to microporous framework MCM-22.

In addition to TPA, other compounds that can be used as SDAs for zeolite seed crystal formation include tetraethylammonium hydroxide; diethylamine; dimethylethylpropylammonium hydroxide; tripropylamine; triethylpropylammonium hydroxide; 1,6 hexanediol; hexane 1,6-diamine; hexamethyleneimine; and pyrrolidine.

The size of the seed crystals can be selected based on the nature of the substrate surface and the method used to deposit them on the surface. Where the substrate surface is porous, for example, seed crystals are typically large enough to span the substrate pores in their preferred orientation. This minimizes seed crystals resting at an undesirable angle with respect to the substrate surface due to the pores. In some embodiments, the seed crystals can, on average, have a minimum dimension of less than about 500 nanometers (e.g., less than about 200 nanometers, such as 100 nanometers or less). Alternatively, or additionally, the seed crystals can have an average maximum dimension of more than about 200 nanometers (e.g., more than about 500 nanometers, such as 800 nanometers or more).

Optionally, the seed crystals can be calcined to remove the structure directing agent prior to being deposited on the substrate. Organic SDAs can be calcined by exposing them to temperatures of about 500° C. or more, for several hours (e.g., about 10 or more hours).

Several different strategies can be used to prepare oriented zeolite seed layers. These include slow dip coating, deposition after cationic polymer adsorption, and covalent bonding on functionalized surfaces. Slow dip coating methods are disclosed, for example, by L. C. Boudreau and M. Tsapatsis in *Chem. Mater.*, 9:1705 (1997). J. Hedlund and co-workers have disclosed methods of deposition after cationic polymer adsorption in *Microporous Mesoporous Mater.*, 28:185 (1999). Methods of covalent bonding on functionalized surfaces are described, for example, by K. Ha, and co-workers in *Adv. Mater.*, 12:1614 (2000).

Figure 4:
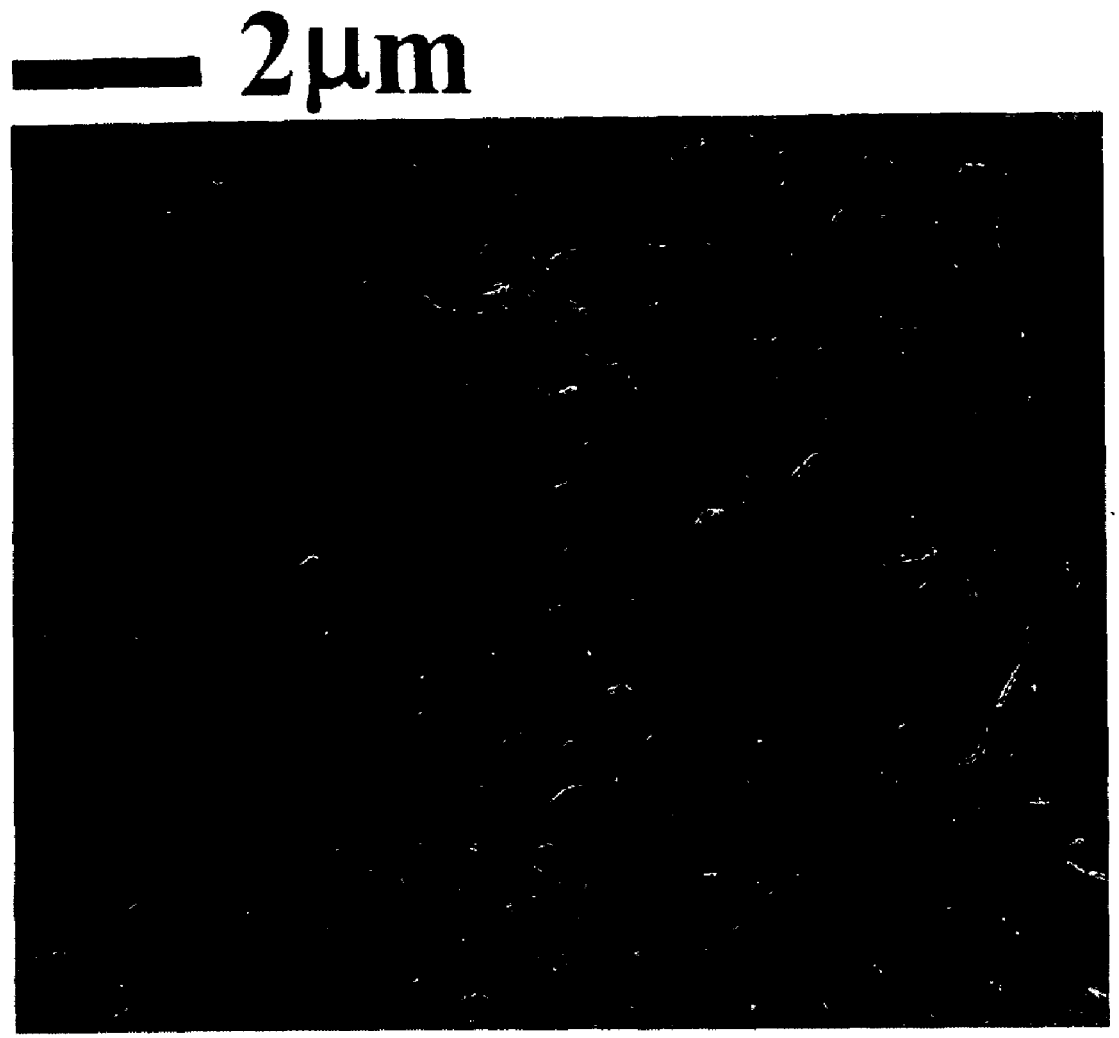
FIG. 4 is an SEM micrograph of a seed layer of silicalite-1 crystals formed using trimer-TPA.

For seed crystals that do not easily form suspensions in an appropriate medium (e.g., water) due to, for example, their size, the method disclosed by Ha can provide good surface coverage and uniformity of the seed crystal monolayer. For example, referring to FIG. 4, this method can be used to deposit 500×200×100 nanometer silicalite-1 seeds on a substrate where the seed layer is composed of nearly a monolayer of silicalite-1 crystals oriented with their b-axis perpendicular to the substrate. The density of defects including empty spots, a-oriented grains, incorporation of twined silicalite-1 seeds and seed deposition in excess of a monolayer is estimated to be approximately 10% by analysis of SEM images. Similarly this method can be used to deposit an approximate monolayer of silicalite-1 seeds on a substrate with their a-axis perpendicular to the substrate using seeds prepared using trimer TPA.

Secondary Growth

Secondary growth of the seed crystal layer can be performed hydro-thermally by exposing the seed crystal layer to a synthesis solution under conditions at which the seed crystals can be grown into a continuous layer. A solution can be prepared for example, by following the steps described by G. Xomeritakis and co-workers in *Ind. Eng. Chem. Res.*, 40:544 (2001). The composition of the synthesis solution can vary depending upon the particular framework material desired. In general, for zeolites the synthesis solution includes a structure directing agent, a base, an aluminum source, a silicon source, and a solvent. The solution components are usually the same as components used to form the seed crystals, although relative component concentrations can vary. The solution can contain elements other than aluminum and silicon, such as boron, phosphorous, titanium, iron.

In a particular embodiment where a layer of zeolite is to be formed, the synthesis solution preferably includes a mixture of trimer tetrapropylammonium hydroxide (trimer TPA), sodium hydroxide (NaOH), aluminum oxide ($Al_2O_3$), silica ($SiO_2$), tetraethylorthosilicate (TEOS), and water ($H_2O$). The trimer TPA serves as the structure directing agent, the NaOH serves as the base, the TEOS and silica serves as the silicon source, the aluminum oxide serves as the aluminum source, and the water serves as the solvent. However, various substitute components can be used for the above. As an example, instead of using trimer TPA, substitutes can include tetraethylammonium hydroxide; diethylamine; dimethylethylpropylammonium hydroxide; tripropylamine; triethylpropylammonium hydroxide; 1,6 hexanediol; hexane 1,6-diamine; and pyrrolidine; or oligomers of the above. The SDA can be the same as or different from the SDA used to form the seed crystals. Useful substitutes for the silicon source include sodium silicate, fumed silica (such as Cab-O-Sil® manufactured by Cabot Corporation, Boston, Mass.), and colloidal silica (such as Ludox® manufactured by du Pont, Wilmington, Del.).

Instead of aluminum oxide, sodium aluminate or aluminum alkoxide can be used. Instead of using NaOH as the base, mineralizing agents such as potassium hydroxide (KOH), can be used, for example.

In another example, where a silicalite layer is to be formed, the solution includes $SiO_2$, trimer TPA, KOH, $H_2O$, and EtOH. While the relative amounts of the constituents can vary, the constituents are preferably used in the approximate molar ratios of about (20-80) $SiO_2$, (1-10) trimer TPA, (5,000-20,000) $H_2O$, (1-16) KOH, and (100-200) EtOH. More preferably, the molar ratios are about (40) $SiO_2$, (5) trimer TPA, (9,500) $H_2O$, and (160) EtOH. With a molar ratio for trimer TPA above or below about 20-80, the crystalline layer can be rough, uneven or discontinuous. Absence of KOH may lead to a rough, poorly intergrown deposit. For molar ratios above or below about 5,000-20,000 for water, the layer can become discontinuous or uneven.

Alternatively, when an a-oriented film of silicalite is desired, the secondary growth of the a-oriented seed layer may be performed using TPA or dimer TPA with C7 carbon chain between the N atoms.

For a synthesis solution without an aluminum source, such as the one described in the previous example, measured amounts of TPA and EtOH are first added to measured amounts of deionized water, and then stirred. A measured amount of $SiO_2$ is then added dropwise while stirring. Initially, the solution may appear turbid. However, with continued stirring and addition of KOH, the solution becomes clear. The resulting synthesis solution is characterized by being substantially clear with low viscosity. It is substantially not in the form of a gel or slurry.

The seed layer on the substrate is exposed to the synthesis solution at an elevated temperature (e.g., between about 50° C. and 200° C., such as about 90° C.) by heating with a heat stage. The seed layer is exposed to the solution under at elevated temperature for a time sufficient to grow the layer of framework material to desired thickness and continuity. Although this time may vary depending on the particular chemistry, the seed layer is usually exposed to the synthesis solution for several hours (e.g., more than about five hours, eight hours, 10 hours). Alternatively, heating can be provided by microwaves. Heating by microwaves can reduce the time required to achieve the same amount of growth.

Undesirable reaction products can be removed by the addition of further reagents or other methods, such as by evaporation.

Optionally, SDA that is included in the layer of framework material during the secondary growth may be removed, e.g., by calcination. As for calcination of the seed crystals, the framework material can be heated to a temperature at which the SDA decomposes, while the framework material remains intact. For example, TPA can be calcined from a zeolite layer at temperatures of about 500° C. or more. Usually, the material is calcined in applications where a porous material is desired because the sites where the SDA molecules were incorporated typically correspond to channels in the structure.

Applications

Membranes of framework materials in accordance with the invention can be used as catalysts as well as for separating materials by contacting fluid against the membrane. Examples of mixtures that can be separated with zeolite membranes include oxygen/nitrogen, nitrogen/methane, carbon dioxide/methane, hydrogen/carbon monoxide, ethanol/water, branched hydrocarbons/straight hydrocarbons, specific types of xylene isomers/other xylene isomers, saturated/unsaturated hydrocarbons, benzene/cyclohexane, benzene/xylene isomers, concentrated biomolecules/fermentation liquors and for the purification of natural gas or flue stack effluents.

Xylene isomer separation by framework material membranes is one test for benchmarking the molecular sieving ability of these membranes. Although other separations (e.g., butane isomers) can be performed satisfactorily by defective membranes, xylene isomer separation relies on intracrystalline molecular sieving and therefore is an ideal probe of nanometer scale defects and intracrystalline transport pathways.

In some embodiments, the membranes can exhibit high para/ortho xylene selectivity and high para-xylene flux. For example, membranes made according to the methods described herein can exhibit para-xylene permeance of more than about $500 \times 10^{-10}$ $mol/m^2sPa$ (e.g., about 800, 900, 1,000, 1,100, 1,200, $1,500 \times 10^{-10}$ $mol/m^2$ sPa or more) with a para/ortho separation factor of more than about 50 (e.g., about 75, 90, 100, 110, 120, 150 or more), as measured using the permeation conditions, set-up, and analysis procedure described by G. Xomeritakis and co-workers in *Ind. Eng. Chem. Res.*, 40:544 (2001), and references cited therein.

Figure 5:
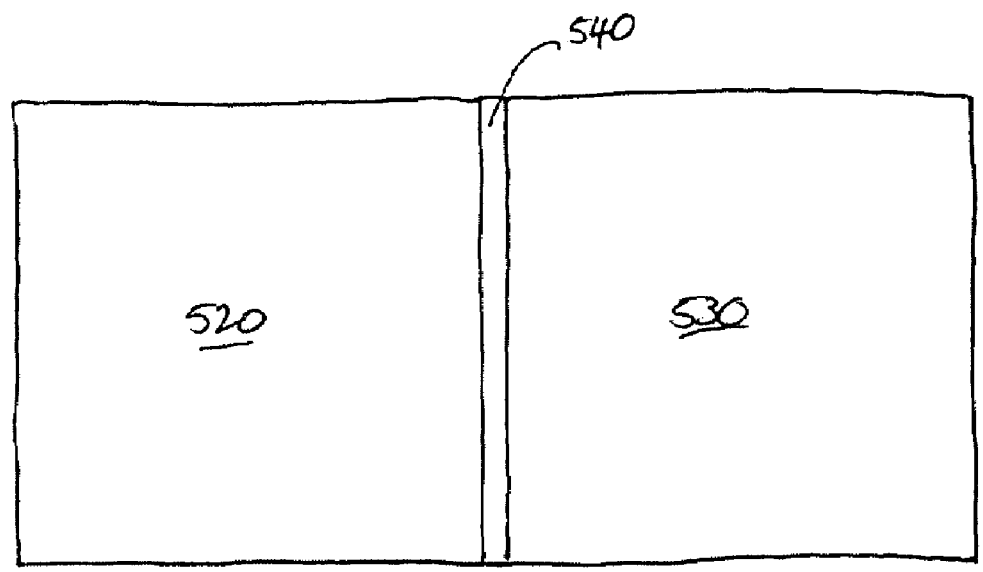
FIG. 5 is a schematic diagram of a reactor including a membrane.

Accordingly, in some embodiments, membranes of framework materials can be used to separate reaction products in a reactor. For example, referring to FIG. 5, a reactor 510 includes a reaction chamber 520 and a product chamber 530. The chambers are separated by a membrane 540. During operation, reagents are placed in reaction chamber 520 under conditions at which they react to form one or more reaction products. Membrane 540 is selected to separate a desired reaction product from other reaction products and/or reagents. Accordingly, the membrane permeance for the desired reaction is substantially greater than for the other reaction products and/or reagents (e.g., 100 times or more greater). Thus, as the desired reaction product is produced, it permeates membrane 520 and collects in product chamber 520 where it can be removed, while the other reaction products substantially remain in chamber 520. Such separation methods are particularly beneficial where the compounds one wishes to separate have properties that make other separation methods (such as selective evaporation) difficult.

Zeolitic membranes, for example, can also be useful in electrochemical systems, as described by D. R. Rolison, *Chem. Rev.*, 90:867 (1990). Composite membranes containing zeolites and pressed zeolite pellets can be used in both batteries and electrodes. True continuous zeolite membrane thin films or membranes of interlocking crystals provide benefits and superior properties, compared to discontinuous zeolite membranes.

The zeolitic membranes formed by the methods disclosed herein can also be used in catalytic systems. The aluminum centers in zeolites can serve as a catalytic site. The aluminum has a net negative charge and therefore must have an associated cation. If the cation is a hydrogen ion, then the zeolite is referred to as being in the acidic form. This acidic form has been found to be very valuable in catalytic cracking as well as other hydrocarbon conversions. These include dehydrogenation, the conversion of olefins and paraffins to aromatics, the conversion of alcohols and ethers to hydrocarbons, the alkylation of aromatics, the disproportionation of toluene and the isomerization of xylenes.

The cation associated with the aluminum in the zeolite can also be a metal ion, such as sodium. Zeolites containing metal ions can carry out base catalyzed reactions. For example, such zeolites can be used to catalyze dehydrohalogenation reactions at temperatures as low as 40° C. to 50° C.

For some applications, transition metal ions such as platinum can be incorporated into the zeolite in place of hydrogen or sodium, by carrying out an ion exchange reaction. The platinum ions can be reduced to the metal form and can provide platinum agglomerates in the pores and channels of the zeolite. These metal agglomerates can serve as catalytic centers for the oxidation or reduction of organic materials. In each of these applications, acid, base and noble metal catalysis, the zeolitic membranes present a promising alternative to current technologies that use powdered zeolites in fluidized and fixed beds.

Framework membranes can also be used as protective layers. As a protective layer, it may be desirable to select a framework structure and orientation that does not provide channels that extend through the depth of the crystalline layer. Alternatively, or additionally, instead of removing the SDA from the membrane, the SDA molecules can be left in the crystal, effectively plugging the channels. As protective layers, the high degree of continuity of the framework material layer can provide films with lower permeability to undesirable materials than columnar membranes. Moreover, due to the large grain size, membranes can be more mechanically robust than those membranes where the grains do not extend through the membranes depth.

EXAMPLES

The invention is further described in the following examples, which do not limit the scope of the invention described in the claims.

Figure 6:
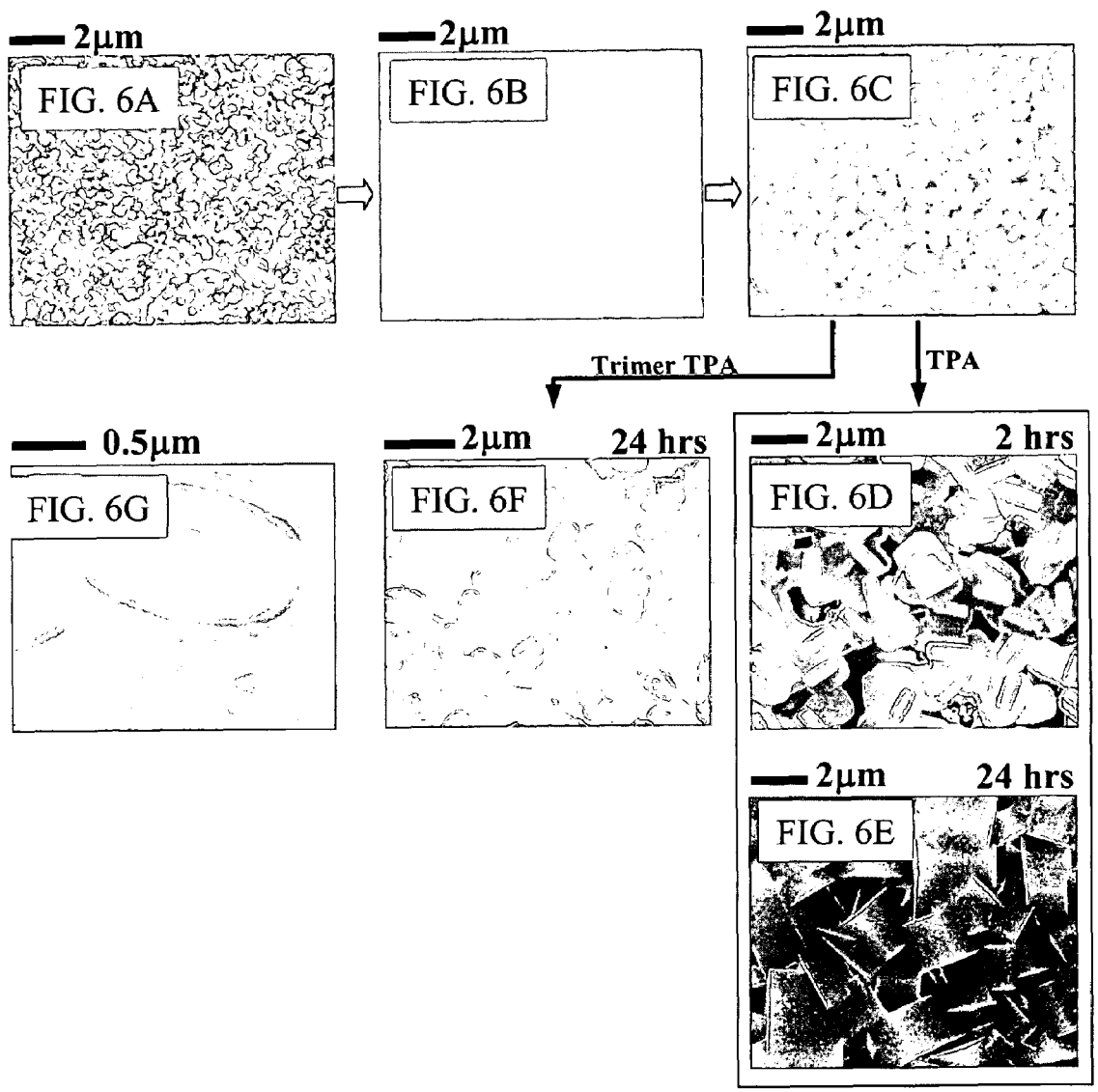
FIG. 6A is an SEM micrograph (top view) of a porous α-alumina support.
FIG. 6B is an SEM micrograph (top view) of a mesoporous silica coating on a porous α-alumina support.
FIG. 6C is an SEM micrograph (top view) of a b-oriented MFI seed layer deposited on a mesoporous silica coating on a porous α-alumina support.
FIG. 6D is an SEM micrograph (top view) of a zeolite layer formed from secondary growth of the b-oriented layer using TPA as an SDA, showing a-oriented twin overgrowths before complete intergrowth of the seed layer can be achieved.
FIG. 6E is an SEM micrograph (top view) of the zeolite layer shown in FIG. 5D following further secondary growth.
FIGS. 6F and 6G are SEM micrographs (top view) of a zeolite layer formed from secondary growth of the b-oriented layer using trimer TPA as an SDA.

Preparation of Supports

α-alumina discs of ~2 millimeters in thickness and 22 millimeters in diameter were used as supports. The discs were made by pressing commercial α-alumina powders (Baikalox, CR-6, available from Baikowski Intl. Corp., Charlotte, N.C.) in a custom-made mold with the aid of a hydraulic press (Carver Model #3912, available from Carver, Inc., Wabash, Ind.) and sintered at 800° C. for about 30 hours and further at 1180° C. for about 2 hours. One side of the disc was polished by SiC sandpaper (Buehler, Grit size 600, available from Buehler, Ltd., Lake Bluff, Ill.) until no obvious scratches were observed by visual inspection under a light microscope. A scanning electron microscope (SEM) micrograph of a surface of an α-alumina support is shown in FIG. 6A. The SEM micrograph shows the porous, relatively rough morphology of the support surface.

Coating with a Mesoporous Silica Layer

The support surface was further smoothed by disposing a smooth mesoporous silica layer on top of the support by a sol-gel technique. This technique was based on the methods disclosed by Brinker and co-workers in "Continuous formation of supported cubic and hexagonal mesoporous films by sol-gel dip-coating," Nature, 389:364 (1997). The procedure was slightly modified in the current study to apply the coating onto a porous support surface. The coating sol was prepared through a two-step hydrolysis procedure.

In the first step, 63 ml anhydrous ethanol (Fluka, 99.5%, available from Aldrich, Milwaukee, Wis.), 60 milliliters tetraethyl orthosilicate (TEOS, 98%, available from Aldrich, Milwaukee, Wis.) and 4.87 grams deionized water (DI water) were first mixed together. The pH of the mixture was adjusted to 4 by adding 0.2 milliliters 1M HCl. Then, the mixture was hydrolyzed by refluxing at 60° C. for 1.5 hours.

A clear sol was obtained after hydrolysis and could be stored in the refrigerator for later use.

In the second step, 4 grams cetyltrimethylammonium bromide (CTAB surfactant, available from Aldrich, Milwaukee, Wis.) were added to 40 milliliters sol that was prepared according to the first step. The pH of the sol was adjusted to 2 by adding 7 milliliters 1M HCl under stirring. The solution was kept stirring until all surfactant was dissolved.

The sol was further aged at 50° C. for 2.5 days to increase the gelation rate so that the sol formed a continuous film on the substrate surface instead of penetrating into substrate pores. During the aging procedure, the sol polymerized and became progressively easier to gel. After the aging process was finished, the sol was diluted 256 times using anhydrous ethanol in order to decrease film thickness. The diluted sol was applied to the support surface by half immersing the support into the diluted sol with the polished side downward. After about 20 seconds, the support was horizontally slipped away and stopped in a vertical position. It was held at this position for about 40 seconds to let the solvent evaporate. Then the support was collected into a petri-dish, and immediately covered to avoid any dust contamination from the air. Finally, all silica films were calcined at 480° C. for about 4 hours with the heating and cooling rate of 1° C./min.

An SEM micrograph of a surface of an α-alumina support coated with a mesoporous silica layer is shown in FIG. 6B. The coated surface shows improved smoothness compared with the uncoated support.

Preparation of b-oriented Seed Monolayer

Seed crystals were synthesized and a b-oriented seed crystal monolayer was deposited on top of the silica film. The seed crystals had a flat shape with approximate dimensions of 500 nanometers along the c-axis, 200 nanometers along the a-axis and 100 nanometers along the b-axis.

The seed crystals were synthesized from the mixture of DI water, tetrapropylammonium hydroxide (TPA, 1.0 M solution in water, available from Aldrich, Milwaukee, Wis.) and tetraethyl orthosilicate (TEOS, 98%, available from Aldrich, Milwaukee, Wis.). The synthesis solution was prepared by adding 30.5 grams TPA aqueous solution (1.0 M solution in water, available from Aldrich, Milwaukee, Wis.) into 240 grams deionized water (DI water). The solution was stirred for about one minute while 30 grams of TEOS (98%, Aldrich, Milwaukee, Wis.) was added to the mixture. Accordingly, the final molar composition of the synthesis solution was $5SiO_2:1TPAOH:500H_2O:20EtOH$. The mixture was stirred at room temperature for about a day (approximately 24 hours), and was then evenly transferred to 7 TEFLON®-lined autoclaves. These autoclaves were then placed inside a rotation frame in an oven and heated to 130° C. for about 12 hours under rotation. Thereafter, the seed crystals were washed by repeated centrifugation and decanting until the pH of the seed suspension became neutral. Finally, the seed crystals were dried first at 90° C. overnight and further calcined at 525° C. for about 10 hours prior to seed layer deposition.

To covalently link seed crystals to the mesoporous silica layer surface, a silane-coupling agent, 3-chloropropyltrimethoxysilane (3CP-TMS, 97+%, available from Aldrich, Milwaukee, Wis.), was used as bridging agent. 3CP-TMS has two functional groups. One of the functional groups reacted with the support surface and the other reacted with seed crystals. Preparation of the seed crystal layer was performed in a humidity-free environment due to the water sensitivity of the bridging agent reactions. The following measures were taken to maintain humidity-free conditions:

(a) all apparatus were thoroughly dried; (b) most operations were operated in a glove box filled with dry argon; (c) reactions were carried out in dry toluene; and (d) dry argon was kept flowing through the whole setup during the reactions.

To deposit seed crystals on a support surface, the support (coated with mesoporous silica layer) was first placed vertically inside a specially designed reactor using a TEFLON® holder. 40 milliliters of dry toluene (Mallinckrodt, 100%, commercially available from VWR International, Bristol, Conn.) was poured into the reactor under the flow of argon. Immediately after the toluene, 4 milliliters of 3CP-TMS were added to the toluene solution. The reactor was then closed and the mixture was heated to the boiling point of toluene (i.e., 110° C. at atmospheric pressure) under reflux. The reaction was allowed to proceed for about 3 hours. After this reaction, the silica layer surface was effectively functionalized with the silane-coupling agent, 3CP-TMS. The support was then taken out of the reactor, washed with fresh toluene, and dried at 130° C. in an oven for 20 minutes. The washing and drying procedure was done in the open air. 0.05 grams of flat seed crystals were placed in a dry reactor along with 40 milliliters of dry toluene. The reactor was sealed and sonicated using an ultrasound sonicator for 10 minutes. After sonication, the functionalized support was placed inside the reactor under the flow of argon, along with a small magnetic stir bar. During this step, the support was placed horizontally inside the reactor with the functionalized silica layer side facing up. The reactor was closed and heated to the boiling point of toluene under reflux. During the reaction, the magnetic stirring bar was rotated at 250 rpm to keep the seed suspension mixed. The reaction lasted for about 5 hours. The seeded support was then sonicated in fresh toluene for 30 seconds to remove any physically adsorbed seeds from the surface. Finally, the seeded support was dried at 90° C. first and then calcined at 450° C. for 4 hours with the heating and cooling rate of 1° C./min.

An SEM micrograph of a b-oriented seed layer is shown in FIG. 6C. The majority of the seed crystals are oriented with their b-axis normal to the substrate surface.

Secondary Growth

The synthesis solution for secondary growth was prepared by first dissolving 0.44 grams of potassium hydroxide (EM Science, 85%, available from VWR International, Bristol, Conn.) in 122 grams of DI water, followed by addition of 30.65 grams of trimer TPA (0.1525M in DI water). The solution was stirred for about one minute while 7.36 grams of TEOS (98%, Aldrich, Milwaukee, Wis.) was added to the mixture. Accordingly, the final molar composition of the synthesis solution was 40 $SiO_2$:5 Trimer TPA:9500 $H_2O$:8 KOH:160 EtOH. The mixture was stirred for another 5 hours at room temperature for hydrolysis. The mixture was then filtered into teflon-lined stainless steel autoclaves, each containing about 35 grams of the synthesis solution.

A seeded support was placed vertically inside the solution with the aid of a TEFLON® holder. The autoclave was sealed and placed into an oven that was pre-heated to 175° C. After 24 hours, the autoclave was removed from the oven and quenched with tap water. After cooling, the sample was taken out, washed with tap water first and then with DI water.

Trimer TPA was prepared by exhaustive alkylation of bis(hexamethylene)triamine (99+%, available from Aldrich, Milwaukee, Wis.)) with 1-iodopropane (99+%, also available from Aldrich, Milwaukee, Wis.) ). Approximately 450 milliliters of 2-butanone (99.5+%, HPLC grade, available from Aldrich, Milwaukee, Wis.), 72.6 grams of anhydrous potassium carbonate (99%, available from Aldrich, Milwaukee, Wis.), and 27.87 grams of triamine were added to a dry three-necked 1 liter flask equipped with a mechanical stirrer, a 60 milliliter addition funnel, and a reflux condenser. The reaction flask was then flushed with purified argon gas (99.999%, obtained from Merriam Graves, West Springfield, Mass.) and vented through a bubbler. 1-iodopropane, 101 milliliters, was transferred to the addition funnel. The reaction mixture was slowly heated to reflux (approximately 85° C.) under argon as the 1-iodopropane was added dropwise to the stirring mixture. The reaction was kept in the dark to avoid iodide oxidation. After approximately 10 hours, the warm, bright yellow reaction mixture was filtered to remove the potassium salts. 2-butanone was removed by rotary evaporation resulting in an off-white semi-solid. Cold 2-butanone was then added to the crude product and the solution was stirred for 1 hour. An equal amount of ethyl acetate (ACS Reagent, 99.5+%, from Aldrich, Milwaukee, Wis.) was slowly added to the stirring mixture. After standing for over 10 hours, the solid product was recovered from the solution by filtration. Traces of KI were separated from the product by dissolving the product in at least 200 milliliters of ethanol (pharmco, 200 proof absolute, obtained from VWR International, Bristol, Conn.). The KI was filtered and the solvent was then removed by rotary evaporation. The product was then recrystallized for a second time as described above, providing a 40 gram, 33% yield.

At this time, the solid product was checked using X-ray diffraction. Where the XRD crystal pattern for KI was detected, the procedure for KI removal and recrystallization using 2-butanone and ethyl acetate was repeated. The purity of the compound was verified using elemental analysis (C, H, N), electrospray ionization mass spectrometry (JEOL JMS700 MStation®, JEOL USA, Inc., Peabody, Mass.), and $^{13}C$-NMR (Bruker AVANCE® 400 DPX 300®, Bruker Biospin Corporation, Billerica, Mass.).

These studies showed that the resulting solid compound was in the form of trimer iodide. This was converted to hydroxide form by ion exchange. First, the solid trimer iodide was dissolved into DI water to make a 0.2 M aqueous solution. Then, 100 milliliters of the aqueous solution was mixed with approximately 15 grams of BIORAD AG® 1-X8 (20-50 mesh, commercially available from BIORAD Laboratories, Hercules, Calif.), a strong anion exchange resin in the hydroxide form. After stirring for over 10 hours, the resin was filtered from the solution and the $OH^-$ exchange efficiency was determined by standard titration with 0.0242 N HCl. This procedure was repeated twice more until the concentration of $OH^-$ in the structure-directing reagent solution remained constant.

Membrane Calcination

Finally, all membranes were calcined to remove organic SDAs. The calcination was carried out at 480° C. The calcination time depended on the membrane thickness. Usually, 10 hours or more was used for thick membranes (e.g., membranes about 10 μm or thicker) and 4 hours for thin membranes (e.g., membranes thinner than about 10 μm). Both the heating rate and the cooling rate were set to 0.5° C./min.

Figure 7:
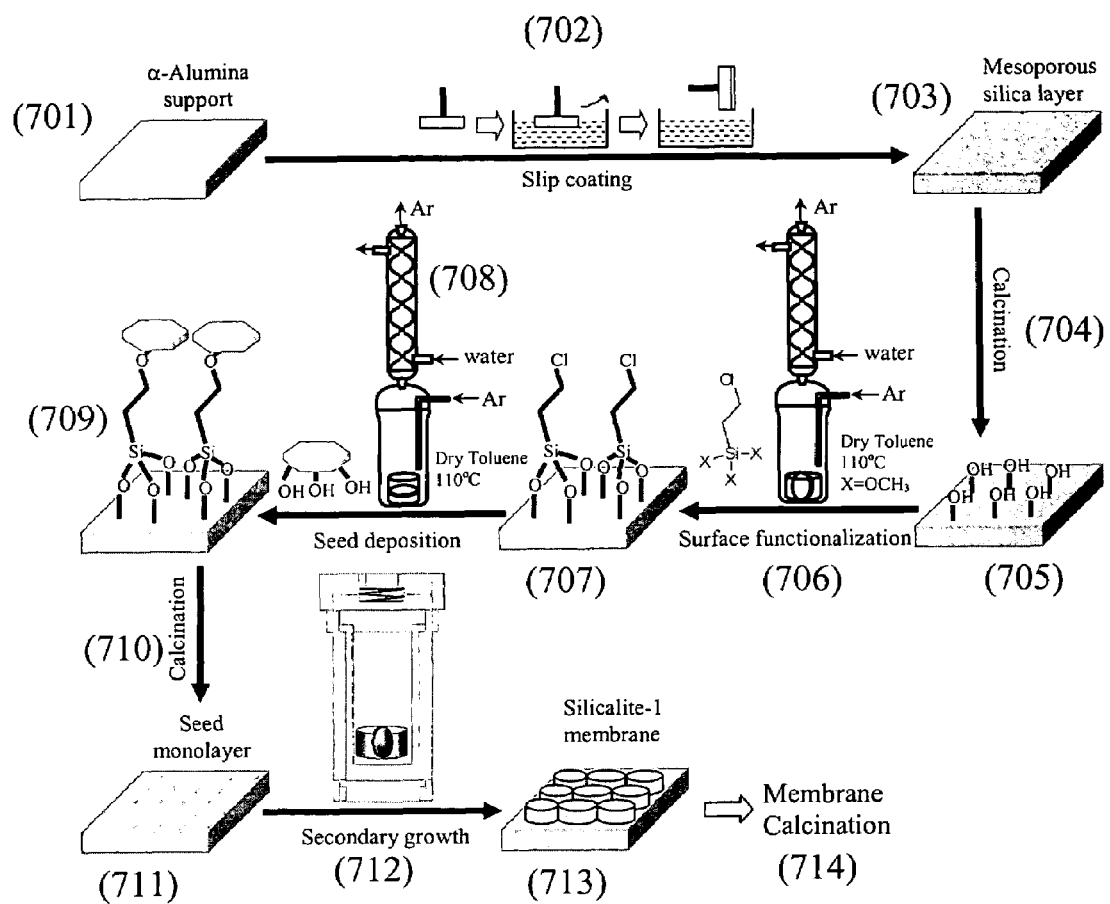
FIG. 7 is a schematic diagram illustrating a method of making a framework material membrane.

The steps of membrane formation through to membrane calcination are illustrated in FIG. 7 and summarized below. Initially, the a-alumina support (701) was slip coated (702) to provide a mesoporous layer (703). The coated support was calcined (704), providing hydroxyl groups on the coated surface (705). Next, the surface was functionalized (706) by bonding a coupling agent to it (707). Seeds were deposited (708) onto the functionalized surface to provide a seed layer (709). The seed layer was calcined (710), and then subjected to secondary growth (712), resulting in a silicalite-1 membrane (713) on the support surface. A final calcination step (714) removed the SDA from the silicate-1 membrane, making it porous.

The porous membranes were then characterized using a variety of techniques, summarized below.

Scanning Electron Microscopy and X-Ray Diffraction

The samples were studied using scanning electron microscopy (SEM) and x-ray diffraction (XRD). Scanning electron microscopy images were taken using a JEOL 5400 Scanning Electronic operated at 15 kV. Before observation, the sample was sputter coated with a layer of gold-palladium alloy to increase conductivity. XRD data were collected using a well-aligned Philips X'Pert® diffractometer with $\lambda(CuK\alpha)$=1.5406 Å. FIGS. 8G-8H show a scanning electron microscopy (SEM) cross section of an MFI membrane and corresponding X-ray diffraction (XRD) traces of the MFI seed layers (bottom traces) and of the MFI membranes (top traces) made by secondary growth of the seed layers for a framework material layer formed using trimer TPA. A top view of such a layer is shown in the micrographs in FIGS. 6F and 6G. Comparable SEM micrographs and XRD spectra for materials formed with a randomly oriented seed layer and c-oriented and [h0h]-oriented secondary growth layers are shown in FIGS. 8A-8B and FIGS. 8C-8D, respectively. FIGS. 8E-8F show an SEM cross-section and XRD spectrum for a layer formed starting with b-oriented seed layers and membranes obtained after secondary growth with TPA having b- and a-orientation. Top view SEM micrographs of a similar layer are shown in FIG. 6D (partial growth) and FIG. 6E (fully intergrown).

Confocal Microscopy

Figure 9A:
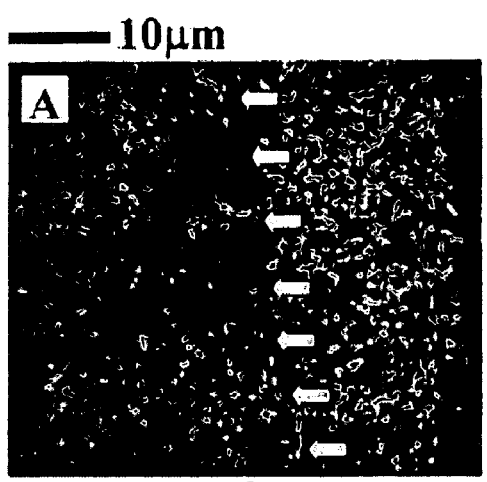
FIG. 9A and FIG. 9B are confocal microscope micrographs of a columnar zeolite membrane.
Figure 9B:
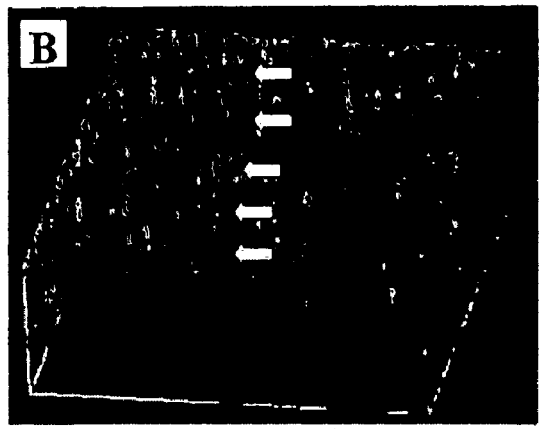
Figure 9C:
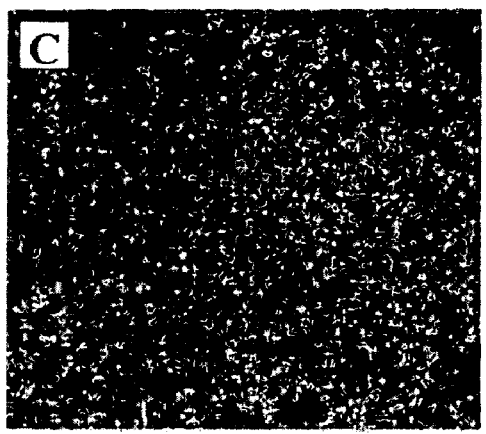
FIG. 9C and FIG. 9D are confocal microscope micrographs of a zeolite membrane formed from secondary growth of a b-oriented seed layer using trimer TPA as an SDA.
Figure 9D:

Samples were studied using confocal microscopy. Confocal images were obtained on a Bio-Rad MRC-600/1000® confocal microscope equipped with an Ar—Kr laser with 488 nanometer, 508 nanometer, and 647 nanometer wavelengths and an oil-immersion objective lens with a numerical aperture of 0.85. Before observation, samples were immersed into fluorescent dye solution (0.1% wt fluorescein-Na in water) for about one week. Sample micrographs are shown in FIGS. 9A-9D. FIGS. 9C-9D are of membranes formed using trimer TPA, while FIGS. 9A-9B are of columnar membranes prepared using the methods disclosed in *AICHE J.*, 44:1903 (1998). The arrows in FIGS. 9A-9B correspond to a crack in the membrane. No cracks are observed in the images of the trimer TPA membrane.

Permeation

Permeation experiments were carried out using the Wicke-Kallenbach mode. A detailed description of this setup and analysis procedure is described by Tsapatsis and co-workers in "Growth, microstructure, and permeation properties of supported zeolite (MFI) films and membranes prepared by secondary growth," *Chem. Eng. Sci.*, 54:3521 (1999). Results of the experiments are shown in FIGS. 10A-10D. These graphs show permeance and separation factor data of membranes of varying crystallographic orientation for ortho- and para-xylene (crystallographic orientation for each membrane is indicated above each graph). The separation factor is defined as the ratio of concentration of component A (i.e., ortho-xylene) and the concentration of component B (i.e., para-xylene) in the feed divided by the ratio of the concentration of component A and the concentration of component B in the permeate.

FIG. 10E compares the performance of membranes made according to the methods disclosed herein, and membranes disclosed by others. Permeance of the α-alumina support is indicated by the dashed line. Data points (1) and (2) corresponds to a three micron thick, randomly oriented membrane reported by Keizer and co-workers in *J. Membr. Sci.*, 147:159 (1998) at 125° C. and 200° C., respectively. Data points (3) and (4) correspond to membranes reported by Xomeritakis and co-workers in *Ind. Eng. Chem. Res.*, 40:544 (2001). Data point (3) corresponds to a 30 micron thick c-oriented membrane, while data point (4) corresponds to a one micron thick 101-oriented membrane. Data points (5), (6), and (7) correspond to MFI membranes prepared using the methods disclosed herein. In particular, data point (5) corresponds to a one micron thick a/b oriented membrane at 180° C., while data points (6) and (7) correspond to a one micron thick b-oriented membrane at 150° C. and 200° C., respectively. Data points (8) and (9) corresponds to a 0.5 micron thick membrane reported by Hedland and co-workers in *Microporous Mesoporous Mater.*, 52:179 (2002), having random orientation at 100° C. and 390° C., respectively. Data point (10) corresponds to a randomly oriented membrane reported by Gump and co-workers in *Ind. Eng. Chem. Res.*, 40:565 (2001), at 150° C.

Figure 11:
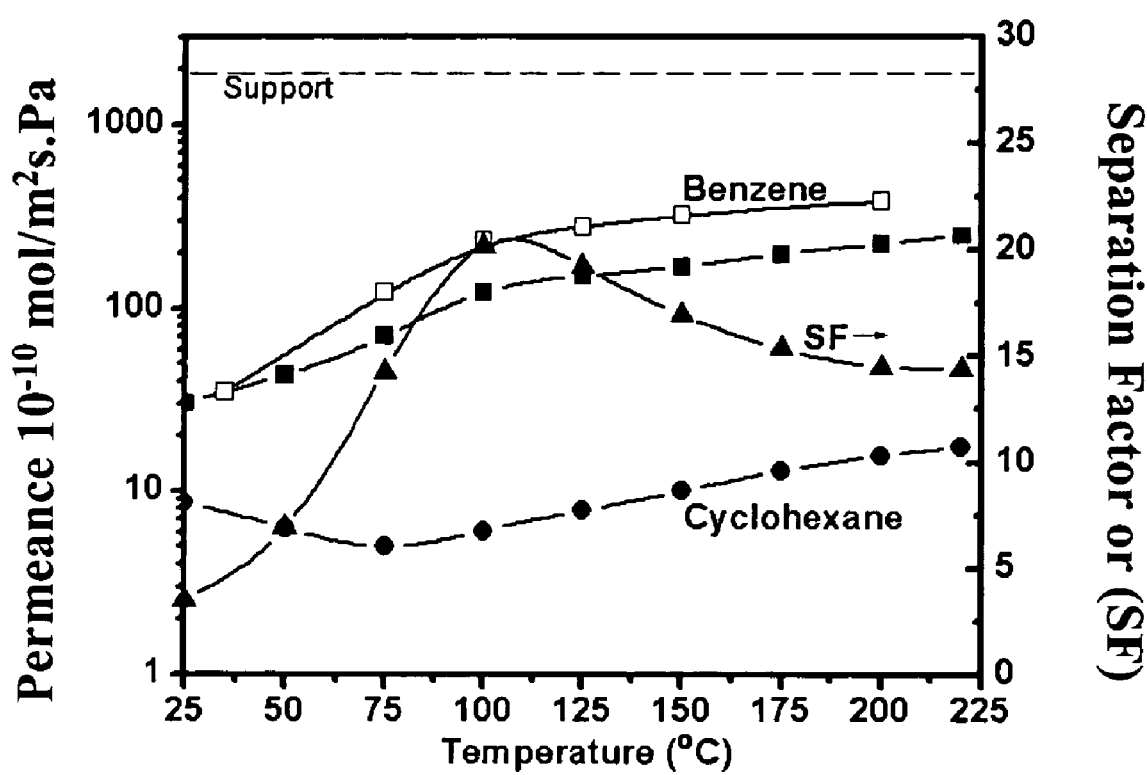
FIG. 11 is a plot of benzene/cyclohexane binary permeation data as a function of temperature for a zeolite membrane.

Results from experiments carried out using the Wicke-Kallenbach mode separating benzene from cyclohexane at various temperatures are shown in FIG. 11. Here, the dashed line shows the permeance of benzene through a silica-coated support, while the open square symbols show the single-component permeance of benzene through the membrane with feed partial pressure of 12.5 kPa. The data shown by triangular symbols is the separation factor of benzene with respect to cyclohexane (i.e., the ratio of benzene and cyclohexane concentrations in the permeate divided by the ratio benzene and cyclohexane concentrations in the feed. The data shown as filled square symbols and circular symbols are, respectively, benzene and cyclohexane permeance for a mixed feed (benzene and cyclohexane feed). The feed partial pressure for benzene was 6.25 kPa and the feed partial pressure for cyclohexane was 6.45 kPa. As shown in FIG. 11, separation factors between about 7 and 20 were measured.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method of forming a film, the method comprising:
   obtaining a layer of oriented seed crystals; and
   growing the oriented seed crystals to form a film defining a surface, wherein the seed crystals growth rate parallel to the surface is substantially the same as their growth rate normal to the surface,
   wherein growing the seed crystals comprises exposing the layer of oriented seed crystals to a solution that comprises a first structure directing agent.

2. The method of claim 1, wherein the solution is an aqueous solution.

3. The method of claim 1, further comprising forming the seed crystals using a seed structure directing agent.

4. The method of claim 3, wherein the first structure directing agent is the same as the seed structure directing agent.

5. The method of claim 1, wherein the oriented seed crystal layer is obtained by disposing seed crystals on a surface of a substrate.

6. The method of claim 5, further comprising applying a coupling agent to the surface of the substrate before disposing the seed crystals wherein the coupling agent bonds to the substrate surface and to the seed crystals.

7. The method of claim 6, wherein the coupling agent covalently bonds to the substrate surface and to the seed crystals.

8. The method of claim 1, wherein the layer of oriented seed crystals is substantially a monolayer.

9. The method of claim 1, wherein the seed crystals comprise a framework material.

10. The method of claim 9, wherein the framework material is a zeolite.

11. The method of claim 1, wherein the seed crystals are disc-shaped.

12. The method of claim 11, wherein each seed crystal has a first crystallographic axis and for a majority of the seed crystals the first crystallographic axes are substantially parallel to each other.

13. The method of claim 12, wherein the first crystallographic axis is the b-axis.

14. The method of claim 1, wherein during the growth of the oriented seed crystal layer, the seed crystals growth rate parallel to the surface is between about 0.5 and two times the growth rate normal to the surface.

15. The method of claim 1, wherein during the growth of the seed crystals, substantially no crystal nucleation occurs in the solution or on a surface of the seed crystals.

16. A method of forming a film, the method comprising:
disposing anisotropic seed crystals on a surface of a substrate, wherein each seed crystal has a short axis; and
exposing the seed crystals to a solution to grow the seed crystals, the solution comprising a structure directly agent,
wherein the growth rate of each seed crystal along its short axis is substantially the same as the growth rate along another axis.

17. The method of claim 16, wherein the seed crystals form an oriented seed crystal layer on the substrate surface.

18. The method of claim 17, wherein for a majority of the seed crystals, the short axis is oriented substantially orthogonal to the substrate surface.

19. The method of claim 16, wherein the seed crystals are exposed to the solution for sufficiently long to form a substantially continuous layer of the seed crystal material.

20. An article comprising:
a porous substrate having a surface; and
a layer of a framework material bound to the surface,
wherein the framework material layer is substantially continuous, and comprises a plurality of crystal grains that extend through the depth of the layer such that a lateral dimension of adjacent crystal grains is substantially the same at different depths through the layer and grain boundaries between adjacent crystal grains are oriented substantially perpendicular with respect to the surface.

21. The article of claim 20, wherein the framework material is a zeolite.

22. The article of claim 20, wherein the framework material is a porous framework material.

23. The article of claim 22, wherein the porous framework material comprises channels that run through the depth of the layer.

24. The article of claim 20, wherein the crystalline grains have an oriented crystallographic axis.

25. The article of claim 24, wherein the oriented crystallographic axis is the b-axis.

26. The article of claim 20, wherein an average ratio of the layer thickness to the crystalline grains' maximum size parallel to the substrate surface is less than about two.

27. The article of claim 20, wherein the layer is substantially intergrown.

28. The article of claim 20, wherein the framework material has an MFI structure.

29. The article of claim 20, wherein the framework material is covalently bound to the substrate surface.

30. The article of claim 20, wherein the article is in the form of a membrane.

31. An article comprising:
a substrate having a surface; and
a layer of a framework material disposed on the surface,
wherein the article has a para-xylene permeance of at least about $1,000 \times 10^{-10}$ mol/m$^2$sPa and a para-xylene to ortho-xylene separation factor of at least about 100:1.

* * * * *

UNITED STATES PATENT AND TRADEMARK OFFICE
CERTIFICATE OF CORRECTION

PATENT NO. : 7,357,836 B2  Page 1 of 1
APPLICATION NO. : 10/794483
DATED : April 15, 2008
INVENTOR(S) : Michael Tsapatsis and Zhiping Lai It is certified that error appears in the above-identified patent and that said Letters Patent is hereby corrected as shown below:

Column 22
Line 46, change "$1,000 \times 10^{-10}$" to -- $1,000 \times 10^{-10}$ --.

Signed and Sealed this

Nineteenth Day of August, 2008

JON W. DUDAS
*Director of the United States Patent and Trademark Office*